United States Patent
Kitano et al.

[11] Patent Number: 5,968,268
[45] Date of Patent: Oct. 19, 1999

[54] COATING APPARATUS AND COATING METHOD

[75] Inventors: Takahiro Kitano, Kumamoto; Katsuya Okumura; Shinichi Ito, both of Yokohama, all of Japan

[73] Assignees: Tokyo Electron Limited, Tokyo; Kabushiki Kaisha Toshiba, Kawasaki, both of Japan

[21] Appl. No.: 09/015,066

[22] Filed: Jan. 28, 1998

[30] Foreign Application Priority Data

Jan. 31, 1997 [JP] Japan ................................. 9-019280
Oct. 2, 1997 [JP] Japan ................................. 9-270125

[51] Int. Cl.$^6$ .............................. B05B 13/04; B05B 7/06; G05D 11/00; A01G 25/00
[52] U.S. Cl. .......................... 118/52; 118/612; 118/320; 366/160.2; 366/152.1; 239/427; 137/896
[58] Field of Search .............................. 366/152.1, 152.2, 366/160.1–160.4, 181.5, 339; 239/427, 427.3, 427.5; 222/145.5, 145.6; 137/896, 897, 88; 251/149.1, 149.2, 149.3, 149; 118/612, 52, 320, 300, 600

[56] References Cited

U.S. PATENT DOCUMENTS 5,464,283 11/1995 Davis .................................. 366/152.1
5,652,919 7/1997 Itoh .
5,658,615 8/1997 Hasebe et al. .

*Primary Examiner*—David A. Simmons
*Assistant Examiner*—Calvin Padgett
*Attorney, Agent, or Firm*—Oblon, Spivak, McClelland, Maier & Neustadt, P.C.

[57] ABSTRACT

Disclosed is a coating apparatus, comprising: a first stream-combining valve communicating with each of a first solvent tank and a resist solution tank, a first pump for supplying an initial resist solution from the resist solution tank toward said first stream-combining valve, a second pump for supplying a solvent from said first solvent supply toward said first stream-combining valve, a first mixer for mixing under stirring the initial resist solution flowing out of said first stream-combining valve with a solvent, a second stream-combining valve arranged downstream of said first mixer and communicating with each of the first mixer and said second solvent supply, a third pump for supplying the solvent from said second solvent supply toward the second stream-combining valve, a second mixer for mixing under stirring said primary mixed liquid material coming out of said second stream-combining valve with a solvent so as to prepare a final mixed liquid material, a nozzle equipped with a liquid spurting port for spurting said final mixed liquid material prepared in said second mixer toward the substrate, and a controller for controlling each of the first, second, third pumps and the first and second stream-combining valves so as to control the mixing ratio of the initial resist solution to the solvent and to control the mixing ratio of the primary mixed liquid material to the solvent.

18 Claims, 14 Drawing Sheets

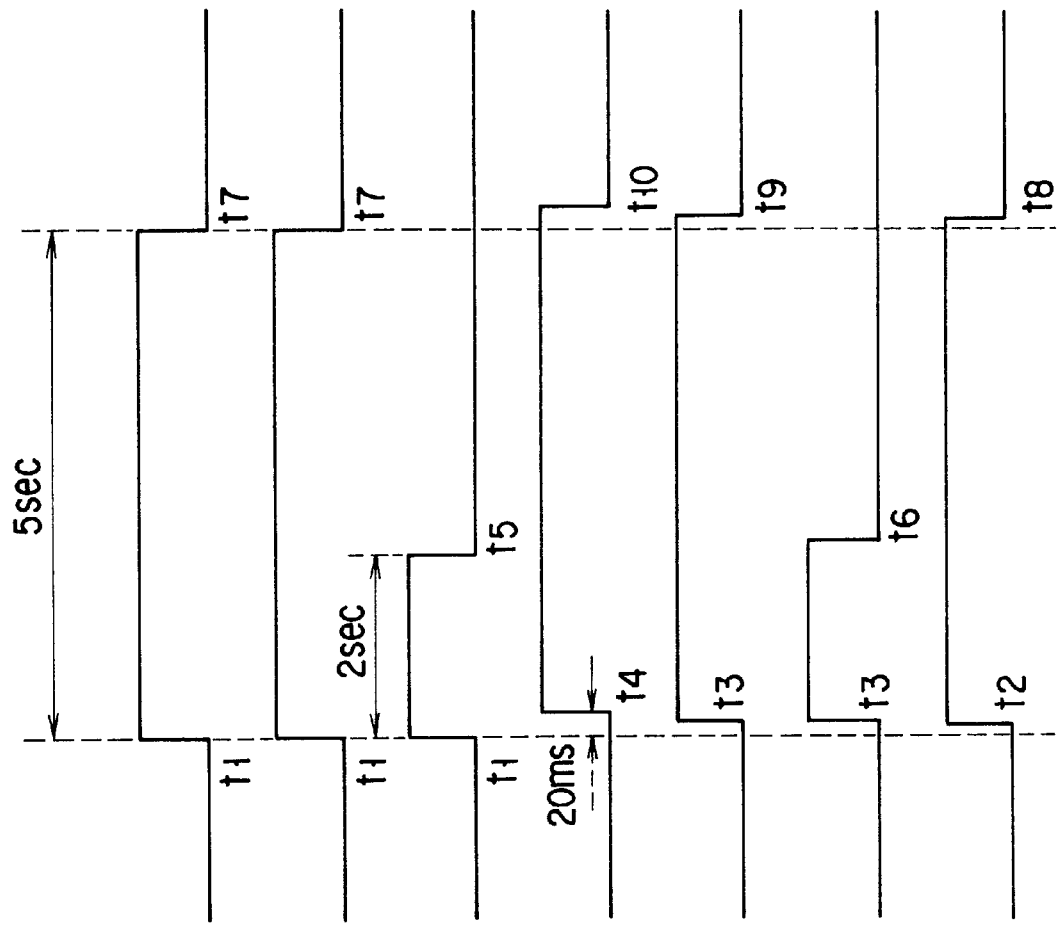

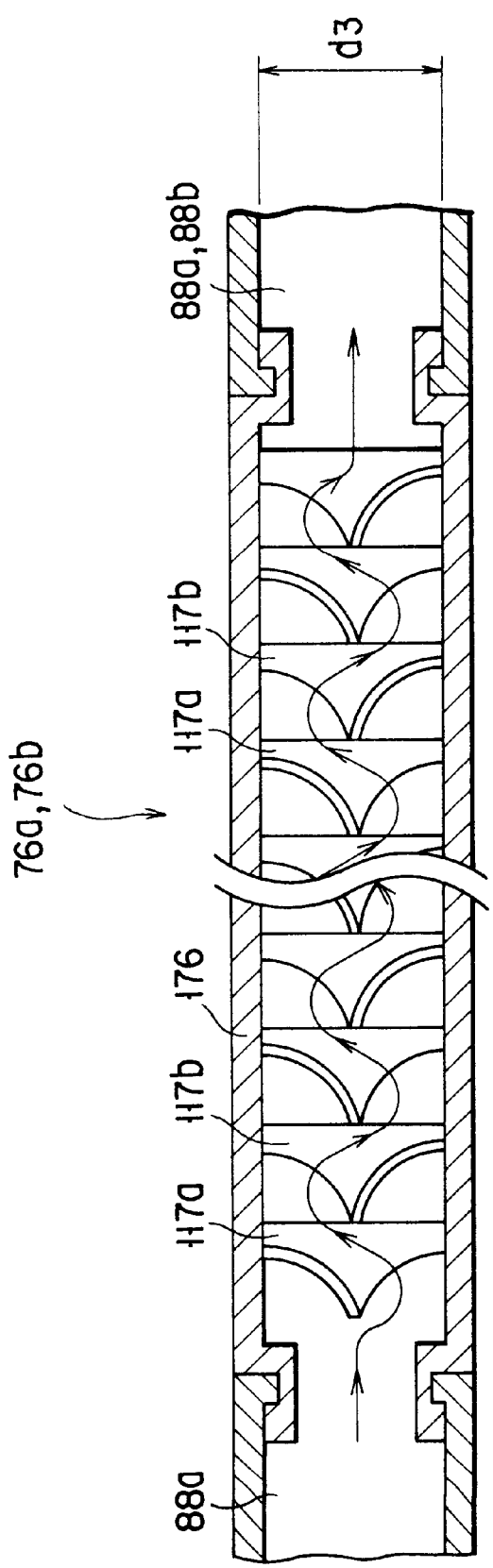
FIG. 11
FIG. 12A
FIG. 12B

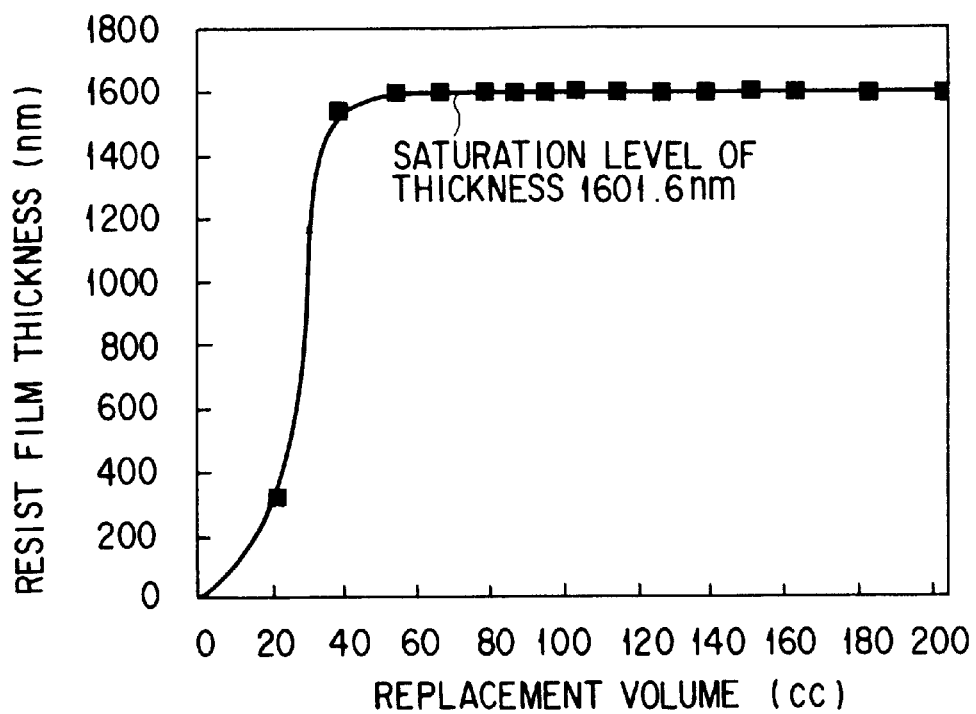
F I G. 15
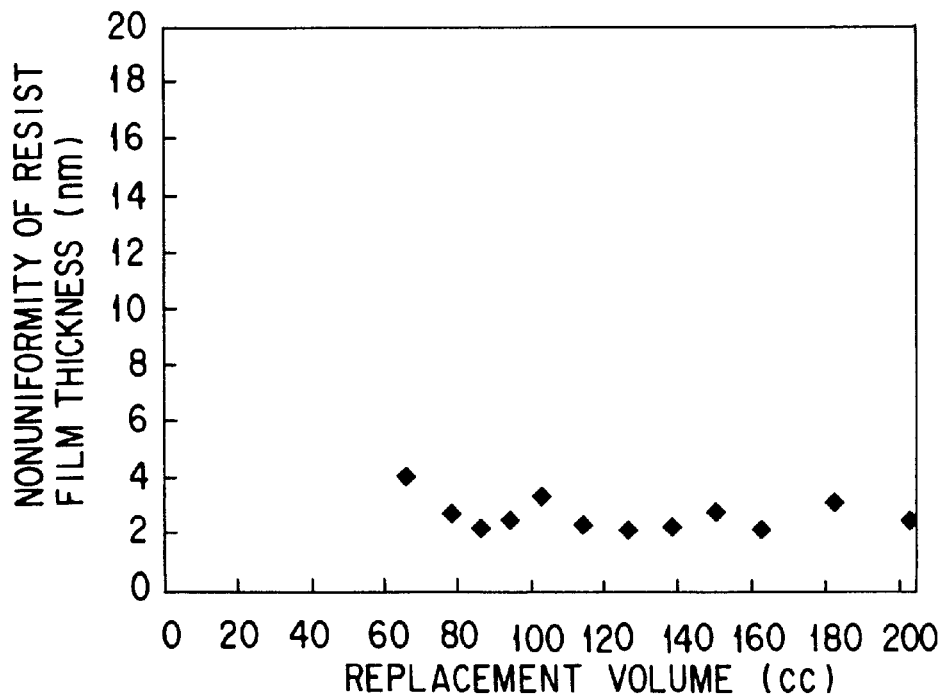
F I G. 16

COATING APPARATUS AND COATING METHOD

BACKGROUND OF THE INVENTION

The present invention relates to a coating apparatus for coating a substrate such as a semiconductor wafer or an LCD (liquid crystal display) substrate with a chemical solution such as a resist solution.

A photolithography technology is employed in a manufacturing process of a semiconductor device. In the photolithography technology, a surface of a semiconductor wafer is coated with resist, followed by exposing the coated resist layer to light in a predetermined pattern and subsequently developing the light-exposed pattern. As a result, a resist film of the predetermined pattern is formed on the wafer. Then, a conductive film is formed over the entire surface of the wafer, followed by selectively etching the conductive film so as to form a predetermined circuit pattern. A coating-developing system as disclosed in, for example, U.S. Pat. No. 5,664,254 is used in such a series of resist processing.

In recent years, the line width of a semiconductor device circuit is required to be on the order of sub-microns. In this connection, severer demands are being directed to further improvements in the uniformity and thickness of the resist film. To meet these requirements, a spin coating method is mainly employed nowadays for coating a surface of a wafer with a resist solution. In the spin coating method, the thickness of the resist film is controlled by adjusting the rotating speed of the wafer. Where, for example, it is desired to decrease the thickness of the resist film, the wafer is rotated at a high speed during the coating step.

In the conventional resist coating apparatus, however, it is mechanically impossible to increase as desired the rotating speed of a spin chuck supporting the wafer. Naturally, the rotating speed of the wafer is limited by the rotating speed of the spin chuck, with the result that it is impossible to make the thickness of the resist film smaller than a certain level. Particularly, in coating the surface of a large wafer having a diameter of, for example, 8 inches or 12 inches, the spreading speed of the resist solution tends to be lowered on the wafer surface, making it more difficult to form a thin resist film on the wafer surface.

Further, immediately after change in the process conditions such as a desired thickness of the resist film and the kind of the resist solution, the resist film formed on a first substrate after the change tends to be nonuniform in thickness, resulting in failure to meet a target value. In such a case, it is necessary to remove the coated resist film from the wafer and to coat again the wafer with a resist solution.

To overcome the above-noted difficulty, used is a resist solution having a suitable viscosity. The viscosity of the resist solution is determined by, for example, a mixing ratio of a solvent such as a thinner, which is added to the resist solution. A resist solution having the viscosity adjusted appropriately is put in a tank, and the tank is incorporated in the resist coating-developing system. In this fashion, the thickness of the resist film is made variable over a wide range.

However, the resist solution is poor in its compatibility with a thinner, with the result that, if a mixture of the resist solution and the thinner is left to stand within the tank over a long period of time, these resist solution and thinner are separated to form an upper layer and a lower layer, respectively, within the tank. This makes it necessary to use a relatively large apparatus for stirring the resist solution-thinner mixture within the tank, which is contradictory to the miniaturization of the apparatus.

It should also be noted that it is impossible to coat uniformly a surface of a large wafer with a resist solution by simply controlling the viscosity of the resist solution. Where, for example, a mixing ratio of the solvent is excessively increased in an attempt to increase the flowability of the resist solution on the wafer surface, the thickness of the resultant resist film is rendered unduly thin. In conclusion, with increase in the diameter of the wafer, it is very difficult to determine appropriately the viscosity of the resist solution for obtaining a desired thickness of the resist film.

As described above, the conventional resist coating apparatus is not satisfactory in that it is difficult to rotate the wafer at a desired high speed in the resist coating step, making it difficult to form a uniform resist film of a desired thickness particularly when a resist film is formed on a wafer having a large diameter. It is also difficult to form a uniform resist film of a desired thickness by means of controlling the viscosity of the resist solution.

In order to decrease the thickness of the resist film formed on the wafer surface, used is a resist solution advantageous in flowability on the wafer surface. As described previously, the viscosity of the resist solution is determined by, for example, the mixing ratio of a solvent such as a thinner. Also, a tank housing a resist solution having the viscosity adjusted appropriately by controlling the mixing ratio of the solvent is incorporated in the coating system, making it possible to control as desired the thickness of the resist film over a wide range.

However, as already pointed out, a resist solution is not compatible with a thinner. If a resist solution-thinner mixture is allowed to stand within the tank, the resist solution and the thinner are separated to form upper and lower layers. This makes it necessary to use a relatively large apparatus for stirring the solution-thinner mixture housed in the tank, which is clearly contradictory to miniaturization of the apparatus.

It should also be noted that it is necessary to replace the tank itself housing a resist solution every time the target thickness of the resist film is changed. It is also necessary to prepare in advance a plurality of tanks housing resist solutions differing from each other in viscosity in order to comply with the change in the target thickness of the resist film. Naturally, it is highly troublesome to take care of such a group of tanks. What should also be noted is that, even if a resist solution of the same viscosity is used, the thickness of the resist film formed is not necessarily the same because the thickness in question is affected by, for example, the daily differences in the environmental conditions. In such a case, it is desirable to use a resist solution having a slightly different viscosity. However, a tank housing a resist solution of a desired viscosity is not necessarily included in the group of tanks incorporated in the system.

To reiterate, in the conventional resist coating apparatus, a tank housing a resist solution having a desired viscosity must be newly used every time the target thickness of the resist film to be formed is changed, making it necessary to prepare in advance a plurality of tanks housing resist solutions differing from each other in viscosity in order to comply with a change in the target thickness of the resist film. Also, it is difficult to cope with a slight change, which is caused by the daily change in the environmental conditions, in the thickness of the resist film formed.

BRIEF SUMMARY OF THE INVENTION

An object of the present invention is to provide a small coating apparatus of a simple construction, which permits further decreasing the thickness of a resist film while maintaining a high uniformity of the resist film over the entire region of the substrate surface.

Another object is to provide a coating apparatus which permits forming a resist film of a desired thickness even on a substrate which is processed first after changes, when made, in the process conditions such as the target thickness of the resist film and the kind of the resist solution used.

According to a first aspect of the present invention, there is provided a coating apparatus, comprising:

a substrate holding member for holding a substrate to be processed;

a process solution supply source housing a first process solution containing a solvent;

first and second solvent supply sources each housing a solvent;

a first stream-combining valve communicating with each of the first solvent supply source and the process solution supply source;

a first pump for supplying the initial process solution from the process solution supply source toward the first stream-combining valve;

a second pump for supplying a solvent from the first solvent supply source toward the first stream-combining valve;

a first mixer for mixing under stirring the initial process solution flowing out of the first stream-combining valve with a solvent;

a second stream-combining valve arranged downstream of the first mixer and communicating with each of the first mixer and the second solvent supply source;

a third pump for supplying the solvent from the second solvent supply source toward the second stream-combining valve;

a second mixer for mixing under stirring the primary mixed liquid material coming out of the second stream-combining valve with a solvent so as to prepare a final mixed liquid material;

a nozzle equipped with a liquid spurting port for spurting the final mixed liquid material prepared in the second mixer toward the substrate held by the substrate holding member; and a controller for controlling each of the first, second, third pumps and the first and second stream-combining valves so as to control the mixing ratio of the initial process solution to the solvent and to control the mixing ratio of the primary mixed liquid material to the solvent.

According to a second aspect of the present invention, there is provided a coating method, comprising the steps of:

(a) holding a substrate to be processed such that the surface to be processed of the substrate is kept substantially horizontal;

(b) adding a solvent to an initial process solution which already contains a solvent and stirring the resultant mixture so as to prepare a primary mixed liquid material having a process solution concentration lower than that of the initial process solution;

(c) adding an additional solvent to the primary mixed liquid material immediately before supply of the process solution to the substrate so as to prepare a final mixed liquid material having a process solution concentration lower than that of the primary mixed liquid material;

(d) supplying first the final mixed liquid material to a surface to be processed of the substrate; and, then, (e) supplying the primary mixed liquid material to the surface to be processed of the substrate.

In the present invention, a surface to be processed of a substrate is wetted with a small amount of the final mixed liquid material having a low process solution concentration. As a result, the primary mixed liquid material, which has a high process solution concentration and is supplied onto the substrate surface in the subsequent step, is allowed to spread rapidly and smoothly over the entire substrate surface, making it possible to form easily a resist coating film of a desired thickness uniformly over the entire surface region of the substrate.

It should also be noted that the final mixed liquid material having a low process solution concentration a low viscosity and a low solid material content is prepared by adding an additional solvent to the primary mixed liquid material immediately before supply of the final mixed liquid material onto the substrate surface. It follows that, even if a thinner, which tends to be separated easily from the process solution, is used as the solvent to be added, the process solution and the thinner are kept mixed sufficiently when the final mixed liquid material is supplied onto the substrate surface. As a result, the substrate surface is wetted uniformly over the entire region, making it possible to suppress nonuniformity in the thickness of the resist film formed on the substrate surface. Naturally, the mixing ratio of the solvent to the process solution is controlled to permit the mixed liquid material to have a viscosity or the concentration of the solid component falling within an allowable range of a target value.

Further, the mixing ratio of the solvent in the mixed liquid material can be changed appropriately depending on the viscosity of the primary mixed liquid material, the size of the substrate to be process, etc., making it possible to form a satisfactory resist coating film under a wide range of various conditions.

Incidentally, the photoresist solution used in the present invention includes, for example, a chemical amplification type resist or novolak type resin resist containing as a base material a polyhydroxystyrene (PHS) resin or a polyvinylphenol resin (PVP). On the other hand, the solvent used in the present invention includes, for example, propylene glycol monomethyl ether acetate (PGMEA), ethyl lactate (EL), ethyl pyruvate (EP), ethyl-3-ethoxypropionate (EEP), methyl-3-methoxypropionate (MMP), methyl-2-n-amyl ketone (MAK), and butyl acetate (BA). These solvents can be used singly or as a mixture of at least two of these compounds.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIGS. 10A to 10G are timing charts collectively showing the operations of the bellows pump and the valve included in a resist solution supply circuit;

FIG. 11 is a cross sectional view showing the inner construction of a static mixer;

FIGS. 12A and 12B show baffle plates each included in the static mixer shown in FIG. 11;

FIG. 15 is a graph showing the relationship between the solid content of a process solution and the thickness of a resist film; and FIG. 16 is a graph showing the relationship between the solid content of a process solution and the nonuniformity in the thickness of a resist film.

DETAILED DESCRIPTION OF THE INVENTION

Figure 1:
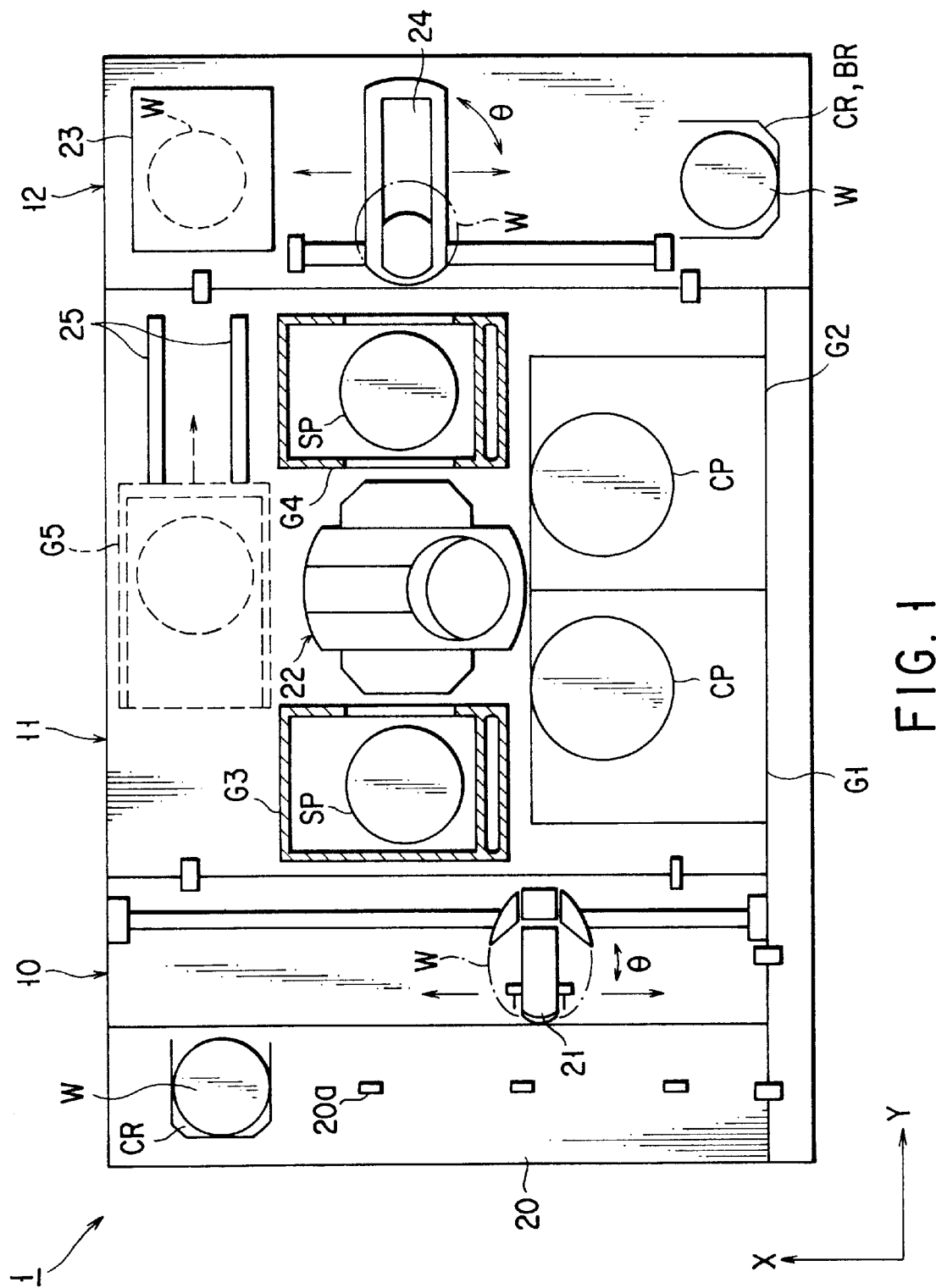
FIG. 1 is a plan view showing a resist coating-developing system.

Let us describe various preferred embodiments of the present invention with reference to the accompanying drawings. Specifically, FIG. 1 shows a coating-developing system 1. As shown in the drawing, the system 1 comprises a cassette section 10, a process section 11 and an interface section 12. A light exposure device (not shown) is disposed adjacent to the interface section 12.

Four projections 20a are formed on a cassette table 20 included in the cassette section 10. The positions of cassettes CR which are disposed on the cassette table 20 are determined by these projections 20a. As apparent from the drawing, four cassettes CR are aligned in an X-axis direction on the cassette table 20. In general, 25 semiconductor wafers are horizontally arranged equidistantly apart from each other within each cassette CR. A first sub-arm mechanism 21, which is arranged movable in a longitudinal direction of the cassette table 20, includes a holder for holding the wafer W, a lift mechanism (not shown) for moving the holder in a Z-axis direction, a horizontal drive mechanism (not shown) for moving the holder in the X-axis direction, and an angle θ-swinging mechanism (not shown) for swinging the holder about the Z-axis. A third process unit group $G_3$ included in the process section 12 is arranged behind the first sub-arm mechanism 21 so as to permit the first sub-arm mechanism 21 to get access to an alignment unit (ALIM) and an extension unit (EXT) each belonging to the third process unit group $G_3$.

The process section 11 includes five process unit groups $G_1$, $G_2$, $G_3$, $G_4$, $G_5$ and a main arm mechanism 22. Each of these process unit groups $G_1$ to $G_5$ includes a plurality of process units stacked one upon the other for applying a resist processing to the wafer W. The main arm mechanism 22 is surrounded by these five process unit groups $G_1$, $G_2$, $G_3$, $G_4$, and $G_5$.

Figure 3:
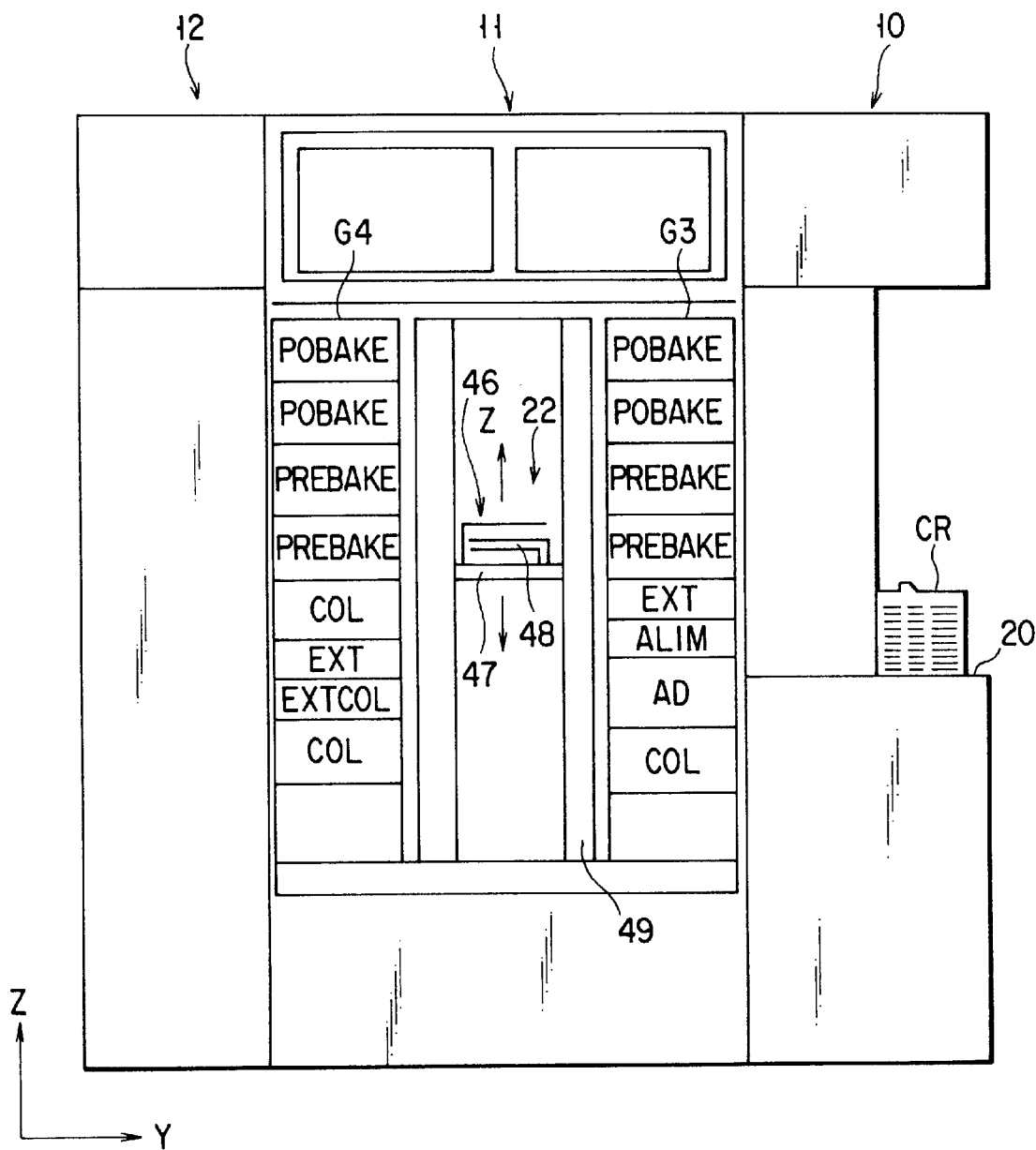
FIG. 3 is a back view showing the resist coating-developing system shown in FIG. 1.

As shown in FIG. 3, the main arm mechanism 22 includes a cylindrical supporting body 49 extending in a Z-axis direction. A wafer transfer device 46 is arranged within the cylindrical supporting body 49. The rotary shaft of a motor (not shown) is joined to a lower portion of the cylindrical supporting body 49 such that the wafer transfer device 46 is swung together with the cylindrical supporting body 49 by an angle θ about the Z-axis.

The wafer transfer device 49 includes a Z-axis driving mechanism (not shown), a transfer base plate 47, and a plurality of arm holders 48. The wafer transfer device 49 is vertically moved within the cylindrical supporting body 49 by the Z-axis driving mechanism. It should be noted that each of the arm holders 48 is supported movable back and forth by a back-and-forth driving mechanism (not shown).

Figure 2:
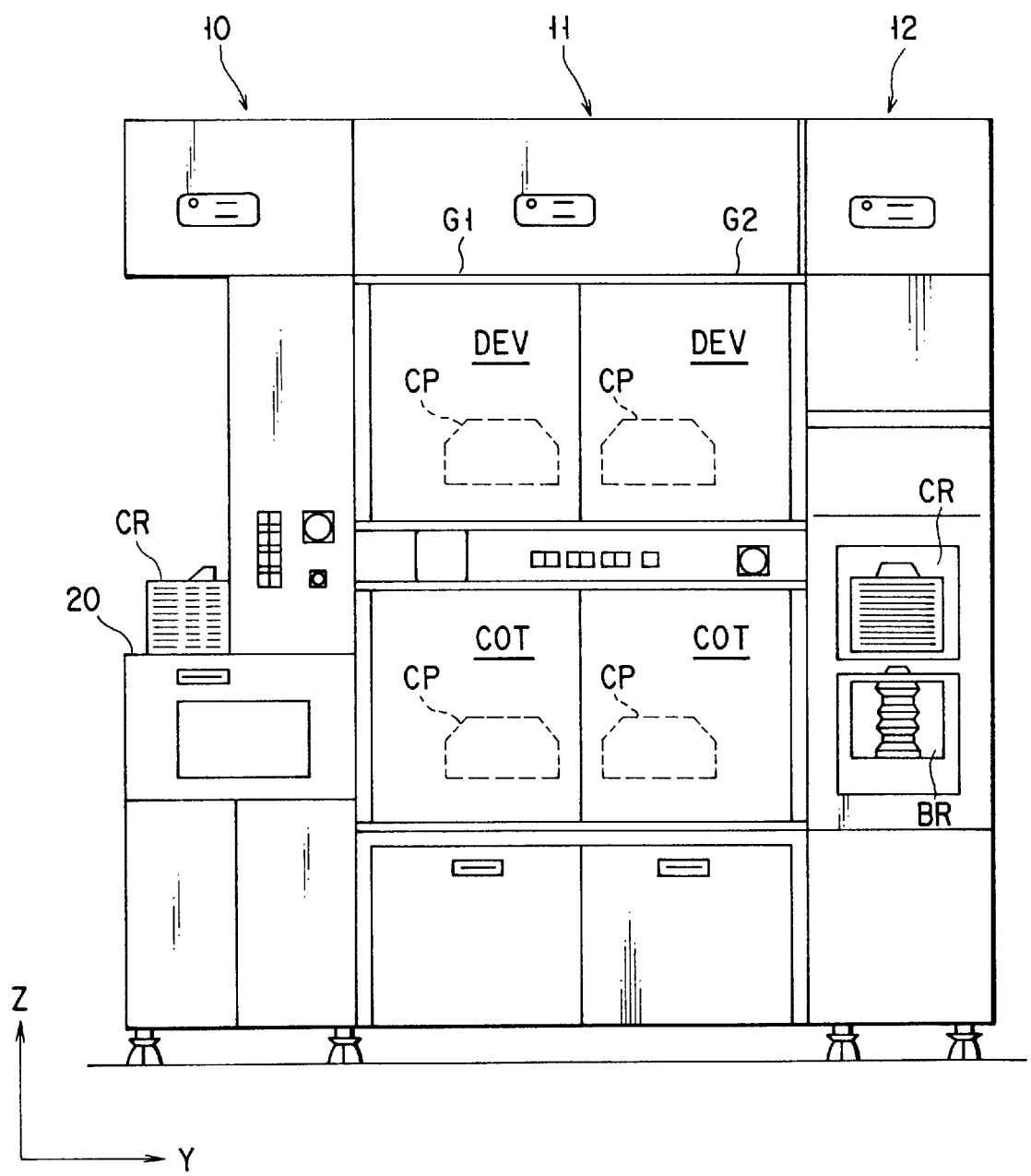
FIG. 2 is a front view showing the resist coating-developing system shown in FIG. 1.

As shown in FIG. 2, the first and second process unit groups $G_1$ and $G_2$ are arranged side by side on the front side of the coating-developing system 1. On the other hand, the third process unit group $G_3$ is arranged adjacent to the cassette section 10, with the fourth process unit group $G_4$ being arranged adjacent to the interface section 12. Further, the fifth process unit group $G_5$ is arranged on the back side of the coating-developing system 1, as shown in FIG. 1.

The first process unit group $G_1$ comprises a resist coating unit (COT) and a developing unit (DEV), as shown in FIG. 2. The resist coating unit (COT) is disposed below the developing unit (DEV). It is desirable to arrange the resist coating unit (COT) in a lower portion of the system 1 in order to make a waste liquid disposal mechanism simple in construction and to facilitate the maintenance operation. A spinner type process device including a cup CP and a spin chuck is arranged within each of the resist coating unit (COT) and the developing unit (DEV). Likewise, the second process unit group $G_2$ includes a resist coating unit (COT) and a developing unit (DEV). The resist coating unit (COT) belonging to the first process unit group $G_1$ is positioned adjacent to the resist coating unit (COT) belonging to the second process unit group $G_2$. Likewise, the developing unit (DEV) belonging to the first process unit group $G_1$ is positioned adjacent to the developing unit (DEV) belonging to the second process unit group $G_2$.

As shown in FIG. 3, the third process unit group $G_3$ includes a cooling unit (COL) for cooling the wafer W disposed on a wafer table SP, an adhesion unit (AD) for applying a treatment to make the wafer surface hydrophobic so as to improve the bonding strength of a resist layer to the wafer surface, an alignment unit (ALIM) for aligning the wafer W, an extension unit (EXT) for temporarily storing the wafer W, two pre-baking units (PREBAKE) each performing a heat treatment before the light exposure treatment, and two post-baking units (POBAKE) each performing a heat treatment after the light exposure treatment. These eight process units are stacked one upon the other in the order mentioned such that the cooling unit (COL) occupies the lowermost position. Likewise, the fourth process unit group $G_4$ includes a cooling unit (COL), an extension-cooling unit (EXTCOL), an extension unit (EXT), a cooling unit (COL), two pre-baking units (PREBAKE), and two post-baking units (POBAKE). These process units also stacked one upon the other in the order mentioned such that the cooling unit (COL) occupies the lowermost position.

It should be noted that the process temperature is low in each of the cooling unit (COL) and the extension cooling unit (EXTCOL) which are arranged in a lower portion of the fourth process unit group $G_4$. On the other hand, the process temperature is high in each of the pre-baking units (PREBAKE), the post-baking units (POBAKE), and the adhesion unit (AD) which are arranged in an upper portion of the fourth process unit group $G_4$. The particular arrangement of these process units is effective for suppressing the thermal interference among these heat treating units.

The interface section 12 is sized substantially equal to the process section 11 in the X-axis direction, but is sized smaller than the process section 11 in a Y-axis direction. Arranged on the front side of the interface section 12 are a flexible pick-up cassette CR and a stationary buffer cassette BR arranged below the pick-up cassette CR. Also, arranged on the rear side of the interface section 12 is a peripheral light exposure device 23. Further, a second sub-arm mechanism 24 is arranged in a central portion of the interface section 12. The second sub-arm mechanism 24 includes an arm holder for holding the wafer W, an X-axis driving mechanism (not shown) for moving the arm holder in the X-axis direction, a Z-axis driving mechanism (not shown) for vertically moving the arm holder in the Z-axis direction, an angle θ-swinging mechanism (not shown) for swinging the arm holder about the Z-axis, and a back-and-forth driving mechanism (not shown) for moving the arm holder back and forth. The second sub-arm mechanism 24 is capable of getting access to each of the cassettes CR, BR, the peripheral light exposure device 23 and the extension unit (EXT) belonging to the fourth process unit group $G_4$. Further, the second sub-arm mechanism 24 is also capable of getting access to a wafer delivery table (not) arranged within the light exposure device.

In the coating-developing system 1 of the construction described above, it is possible to install the fifth process unit group $G_5$ on the rear side of the main arm mechanism 22. The fifth process unit group $G_5$ is arranged movable along a Y-axis guide rail 25. If the fifth process unit group $G_5$ is shifted in the Y-axis direction, a free space can be secured behind the main arm mechanism 22, with the result that the maintenance operation of the main arm mechanism 22 can be facilitated.

Figure 4:
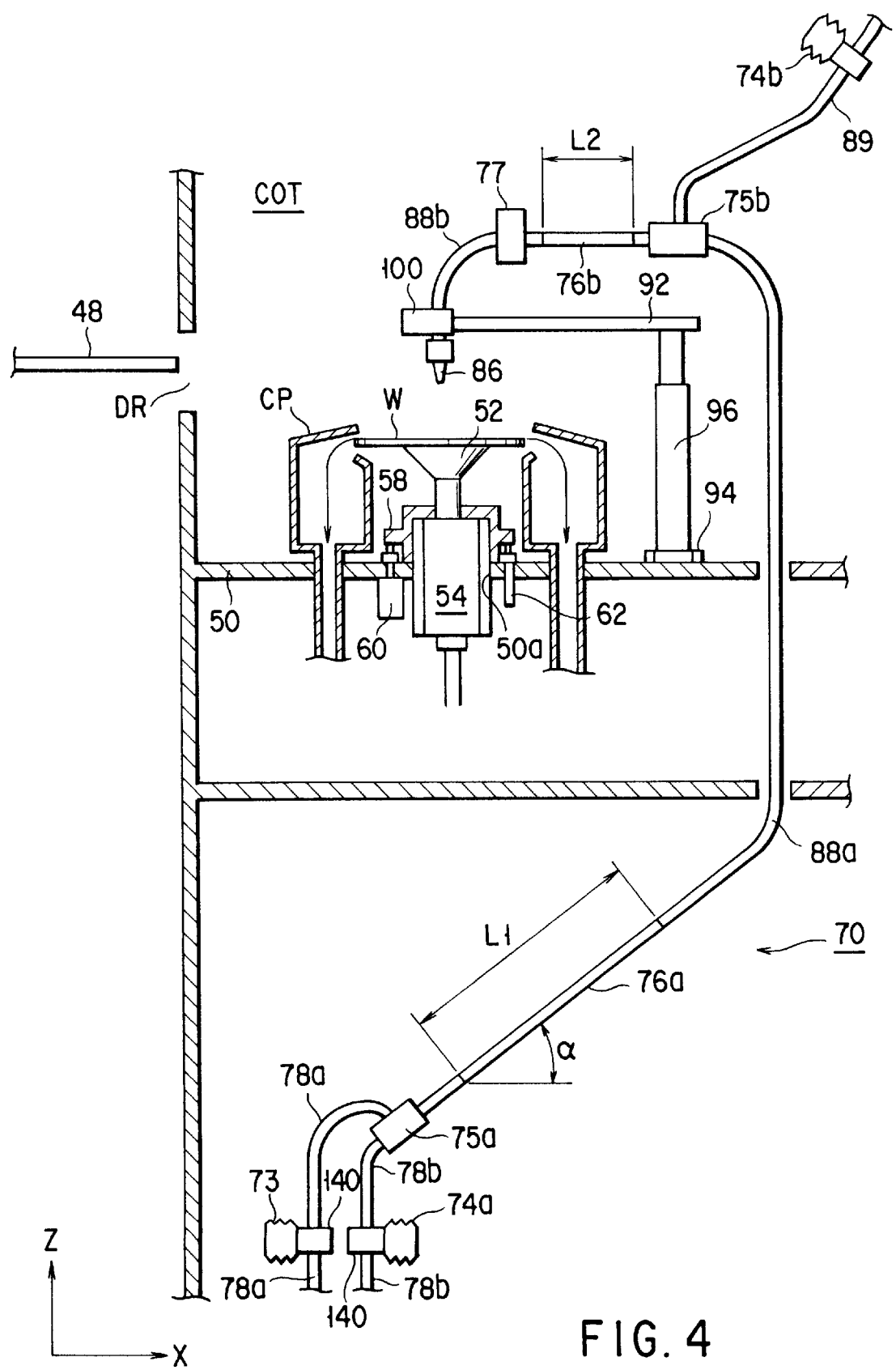
FIG. 4 is a cross sectional view schematically showing the entire coating apparatus according to one embodiment of the present invention.
Figure 5:
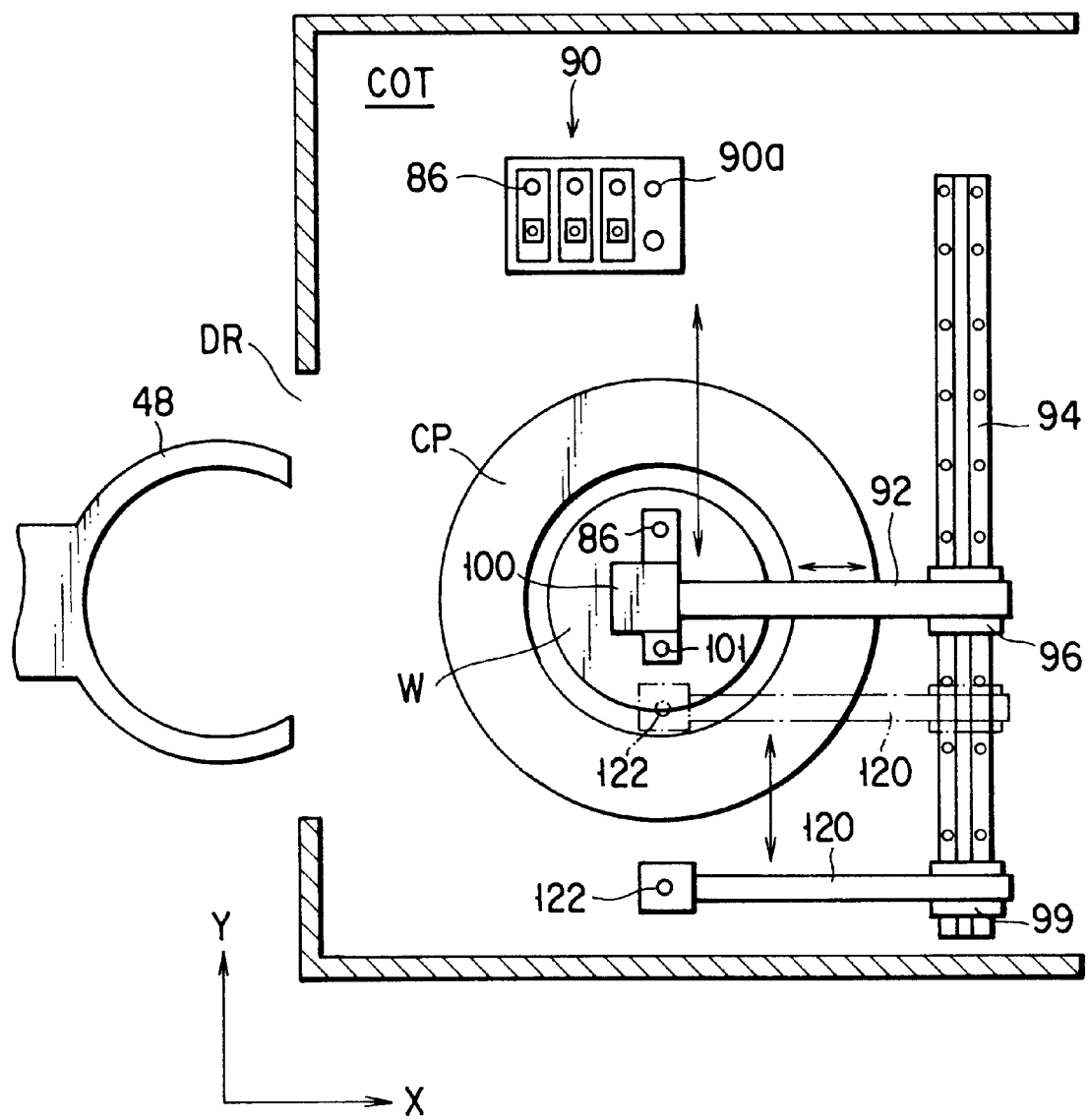
FIG. 5 is a plan view showing the entire construction of a resist coating unit.

FIGS. 4 and 5 collectively show in detail the construction of the resist coating unit (COT). As shown in these drawings, a spin chuck 52 is arranged movable in a vertical direction inside the cup CP. A plurality of suction holes (not shown) are open in the upper surface of the spin chuck 52 such that the wafer W can be held by vacuum suction on the spin chuck 52. A lower portion of the spin chuck 52 is joined to the rotary driving shaft of a motor 54.

The body of the motor 54 is arranged within an opening 50a made in a unit bottom plate 50. An aluminum flange cap 58 is disposed to cover the upper end of the motor 54. The flange cap 58 of the motor 54 is joined to and supported by an air cylinder 60 and a vertical guide 62. It should be noted that power source circuits for the motor 54 and for the air cylinder 60 are connected to an output terminal of a controller 131 shown in FIG. 13.

In the resist coating step, the lower end of the flange cap 58 is in tight contact with the unit bottom plate 50 in the vicinity of the outer circumferential region of the coating unit (COT) so as to keep hermetic the inner region of the resist coating unit (COT). As shown in FIG. 5, a transfer port DR is formed through a side wall of the resist coating unit (COT). The wafer W is put into and taken out of the unit (COT) through the transfer port DR by the arm holder 48 of the main arm mechanism 22. When the wafer is taken out of the resist coating unit (COT), a rod is projected upward from the air cylinder 60 so as to move upward the wafer W. Then, the arm holder 48 of the main arm mechanism 22 is inserted into the free space formed below the wafer W. Under this condition, a lift pin (not shown) is moved downward so as to dispose the wafer W on the arm holder 48.

The cup CP is arranged to surround the wafer W disposed on the spin chuck 52. A lower portion of the cup CP communicates with a plurality of drain passageways. The waste liquid centrifugally separated from the wafer W during rotation of the wafer is discharged to the outside of the coating unit (COT) through the drain passageways noted above. Further, an upper portion of the cup CP is open. The wafer W is disposed on the spin chuck 52 through the upper opening of the cup CP. Incidentally, a lid (not shown) which can be opened and closed is arranged to close the upper opening of the cup CP.

A resist nozzle 86 is detachably mounted to a free end portion of a scan arm 92 and held by a holder 100. The proximal end portion of the scan arm 92 is held horizontal by a nozzle operating mechanism 96, which includes a Y-axis driving mechanism (not shown), a Z-axis driving mechanism (not shown), and an X-axis driving mechanism (not shown). A Y-axis guide rail 94 is formed on the unit bottom plate 50 such that the nozzle operating mechanism 96 is moved in the Y-axis direction by the Y-axis driving mechanism. Also, the nozzle 86 is moved in a vertical direction together with the scan arm 92 by the Z-axis driving mechanism. Further, the nozzle 86 is moved in the X-axis direction by the X-axis driving mechanism.

As shown in FIG. 5, a nozzle waiting section 90 is formed adjacent to the cup CP arranged within the resist coating unit (COT). The resist nozzle 86 during non-use is held within the nozzle waiting section 90 such that the liquid spurting port of the nozzle 86 is inserted into a hole 90a of a solvent atmosphere chamber. A plurality of resist nozzles 86 are held within the nozzle waiting section 90 to permit a suitable nozzle 86 to be selected from among those held within the waiting section 90 depending on the kind and viscosity of the resist solution used. Of course, these resist nozzles 86 are allowed to communicate with different kinds of resist solution supply sources $71_1$ to $71_n$, respectively.

As described previously, the holder 100 is mounted to the distal end portion of the scan arm 92 so as to permit the holder 100 to take the resist nozzle 86 from within the nozzle waiting section 90. Further, a thinner nozzle 101 is mounted to the holder 100 so as to permit a thinner to be supplied from the thinner nozzle 101 onto the wafer surface prior to supply of a resist solution onto the wafer surface. The thinner nozzle 101 makes it possible to perform a so-called "pre-wet coating treatment".

Further, a second nozzle operating mechanism 99 is mounted movable together with the first nozzle operating mechanism 96 on the guide rail 94. The second nozzle operating mechanism 99 is substantially equal in construction to the first nozzle operating mechanism 96. The proximal end portion of a horizontal scan arm 120 is supported by the second nozzle operating mechanism 99. On the other hand, a rinse nozzle 122 for side rinsing is mounted to the free end portion of the horizontal scan arm 120.

As shown in FIG. 4, the resist nozzle 86 is connected via a resist solution supply pipe 88 to a resist-thinner mixing device 70 arranged below the resist coating unit (COT).

Figure 6:
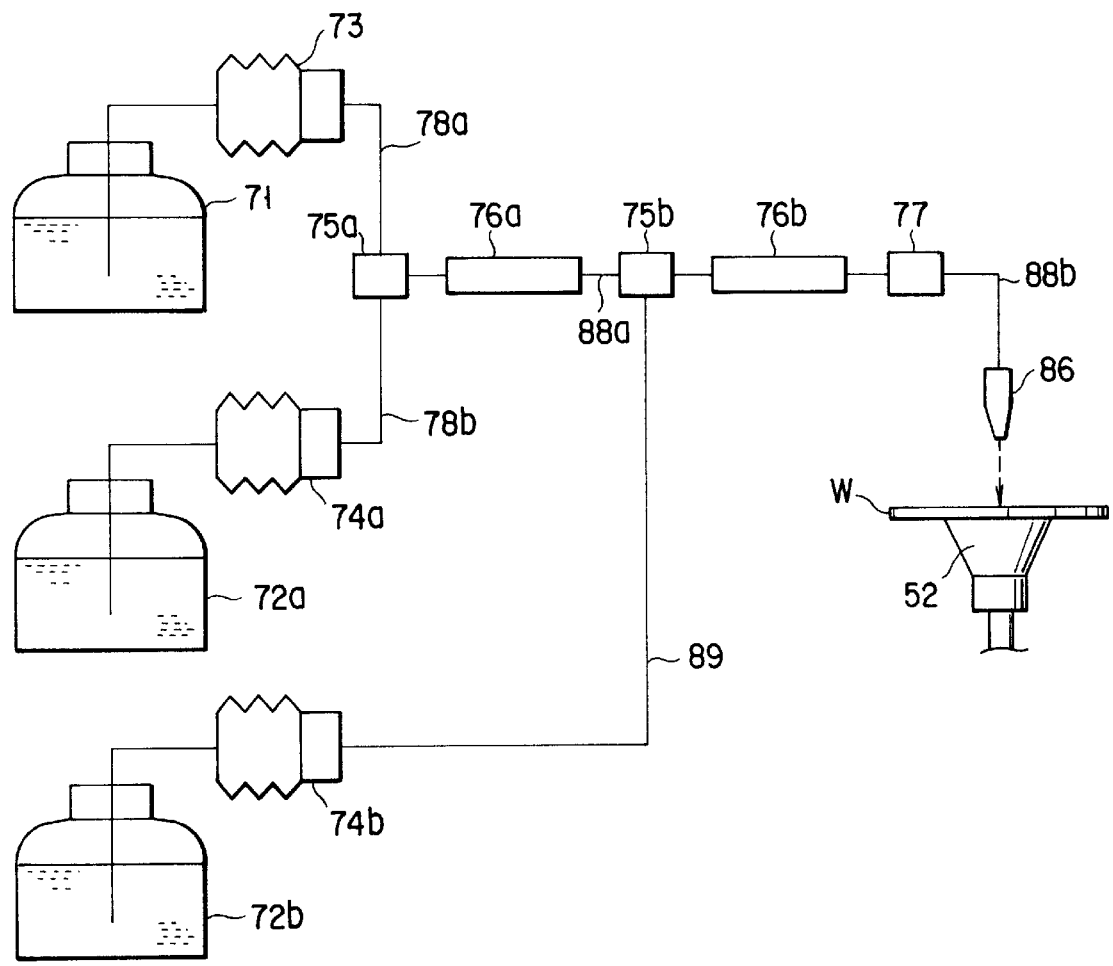
FIG. 6 is a block diagram showing a resist-thinner mixing apparatus included in the resist coating unit shown in FIG. 5.

FIGS. 6 to 11 collectively show in detail the resist-thinner mixing device 70. As shown in FIG. 6, the resist-thinner mixing device 70 comprises a resist tank 71 storing a resist solution, two thinner tanks 72a, 72b each storing, for example, a thinner as a solvent, a front stage stream-combining valve 75a, a resist bellows pump 73 for sucking up the resist solution from within the resist tank 71 and for introducing the sucked resist solution into the front stage stream-combining valve 75a, a first solvent bellows pump 74a for sucking up the thinner from within the thinner tank 72a and for introducing the sucked thinner into the front stage stream-combining valve 75a, a rear stage stream-combining valve 75b, a second solvent bellows pump 74b for sucking up the thinner from within the second thinner tank 72b and for introducing the sucked thinner into the rear stage stream-combining valve 75b, a front stage static mixer 76a, a rear stage static mixer 76b, and a valve 77 mounted to the resist supply pipe 88 extending between the rear stage static mixer 76b and the resist nozzle 86. The fluid passageways of the resist solution and the thinner are opened simultaneously to permit these streams to be combined within the front stage stream-combining valve 75a. On the other hand, the fluid passageways of the resist-thinner mixed stream and the thinner stream are opened or closed to permit these two streams to be combined for a predetermined period of time within the rear stage stream-combining valve 75b. Further, the resist-thinner combined stream formed within the front stage stream-combining valve 75a is mixed with a thinner within the front stage static mixer 76a. Still further, the resist-thinner combined stream formed within the rear stage stream-combining valve 75b is mixed with a thinner within the rear stage static mixer 76b. These members of the resist-thinner mixing device 70 are connected to each other via pipes exhibiting a high resistance to corrosion, e.g., Teflon tubes.

The resist tank 71 and the thinner tanks 72a, 72b are arranged outside the coating-developing system 1 of the present invention and connected to the resist bellows pump 73 and the solvent bellows pumps 74a, 74b via pipes 78a, 78b, respectively.

FIGS. 7 and 8 collectively show in detail the construction of the bellows pumps used in the present invention. It should be noted that the first and second bellows pumps 73 and 74 are substantially equal to each other in construction. Therefore, the construction of the first bellows pump 73 alone is shown in the drawings.

As shown in the drawings, the bellows pump 73 comprises a folding pipe 102, an air cylinder 107, and a liquid flowing section 140. The folding pipe 102, which consists of a foldable bellows made of a soft resin, is fastened at one end to a flange 145 of the liquid flowing section 140 and, at the other end, to a flange 147 of a blind plate 146. A rod 107a of the air cylinder 107 is connected to the rear surface of the blind plate 146. The air cylinder 107 communicates with a compressed air supply source (not shown) which is controlled by the controller 131. Further, a shield plate 137 is mounted to the outer circumferential surface of the blind plate 146.

Figure 7A:
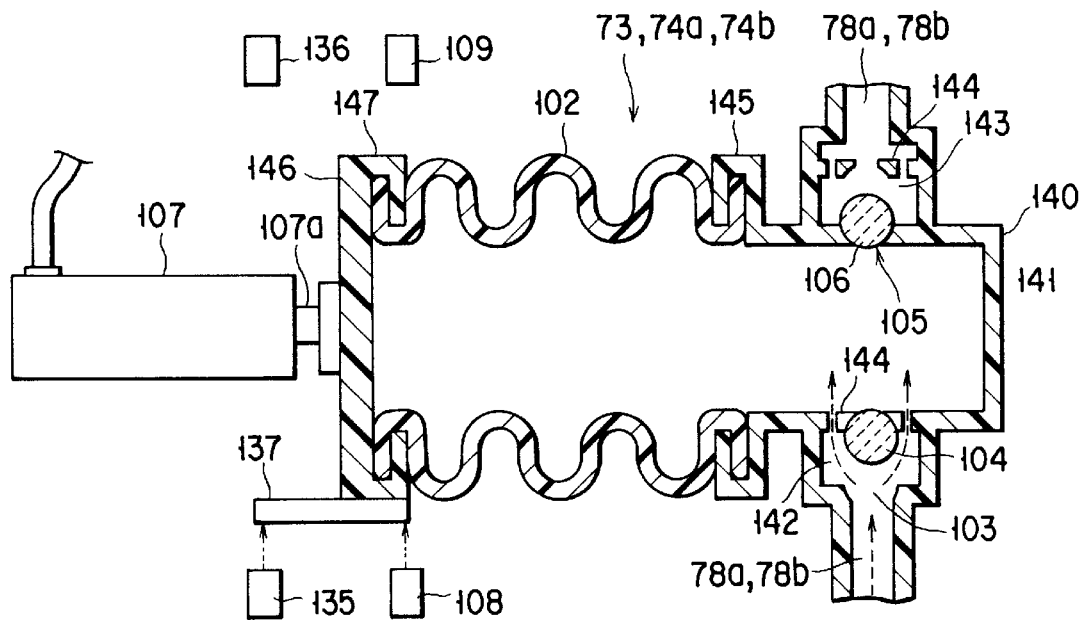
FIGS. 7A and 7B are cross sectional views each showing in detail a bellows pump.
Figure 7B:
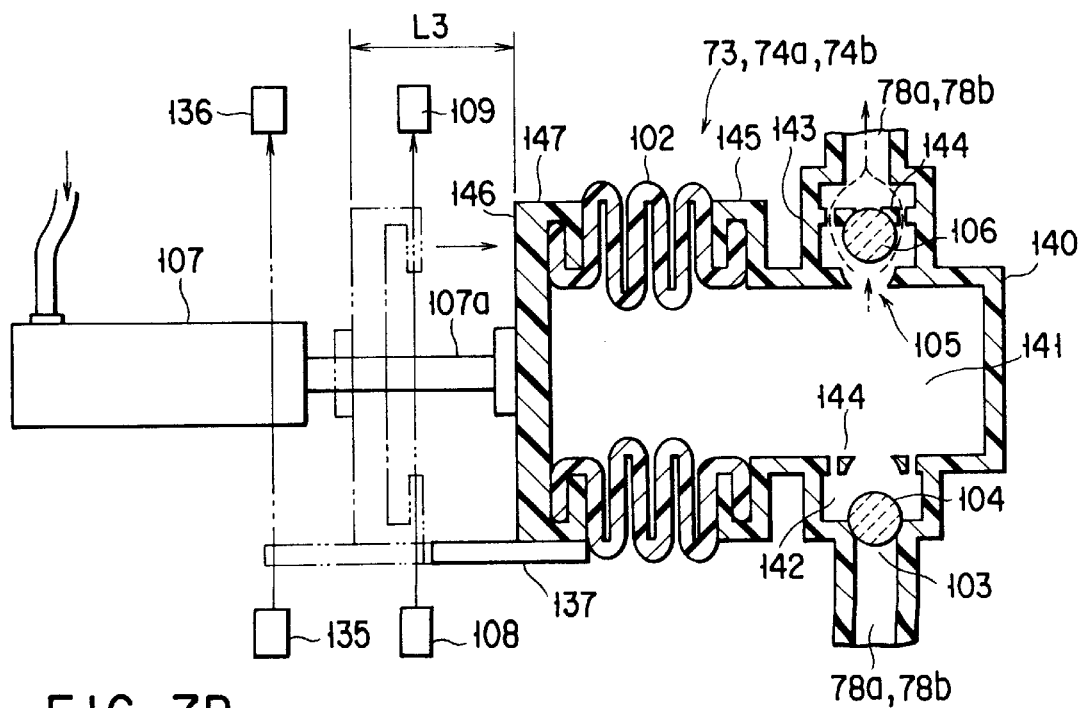

Two sets of sensors (108, 109) and (135, 136) are arranged in the vicinity of the folding plate 102. The displacement of the folding pipe 102 is detected by these sensors (108, 109) and (135, 136). It should be noted that, when the rod 107a is moved backward so as to be inserted into the cylinder 107 to elongate the folding pipe 102, the light emitted from a light emitting section 108 of the first sensor and the light emitted from a light emitting section 135 of the second sensor are both shielded by the shielding plate 137, as shown in FIG. 7A. On the other hand, when the rod 107a is moved forward from within the cylinder 107 so as to fold the folding pipe 102, the light emitted from the light emitting section 108 of the first sensor is transmitted to reach a light receiving section 109, as shown in FIG. 7B. Likewise, the light emitted from the light emitting section 135 of the second sensor is also transmitted to reach a light receiving section 136. Based on the result of detection of these sensors (108, 109) and (135, 136), the controller 131 controls the operation of the cylinder 107 so as to permit the bellows pumps 73 and 74 to supply suitable amounts of the resist solution and thinner to the downstream devices.

If the folding pipe 102 is elongated as shown in FIG. 7A, a ball valve 142 on the upstream side is opened to permit the liquid material to be sucked into a liquid reservoir 141. If the folding pipe 102 is folded as shown in FIG. 7B, ball valves 142 and 143 on the upstream side and downstream side are closed and opened, respectively, with the result that the liquid material is pushed out of the liquid reservoir 141 toward a liquid supply circuit 78a.

The fluid flowing section 140 comprises the liquid reservoir 141 and a pair of the ball valves 142, 143. The ball valve 142 is arranged on the upstream side of the liquid reservoir 141, with the other ball valve 143 being arranged on the downstream side of the liquid reservoir 141. The ball valve 142 on the upstream side includes a hard ball 104 and a stopper 144. Likewise, the ball valve 143 on the downstream side includes hard ball 105 made of, for example, a ceramic material and a stopper 144.

The liquid reservoir 141 of the first bellows pump 73 communicates with the inner space of the folding pipe 102 and also communicates with the resist supply circuit 78a. On the other hand, the liquid reservoir 141 of the second bellows pump 74 communicates with the inner space of the folding pipe 102 and also communicates with a thinner supply circuit 78b. As shown in FIG. 6, these resist supply circuit 78a and the thinner supply circuit 78b are combined within the stream-combining valve 75a.

Figure 8A:
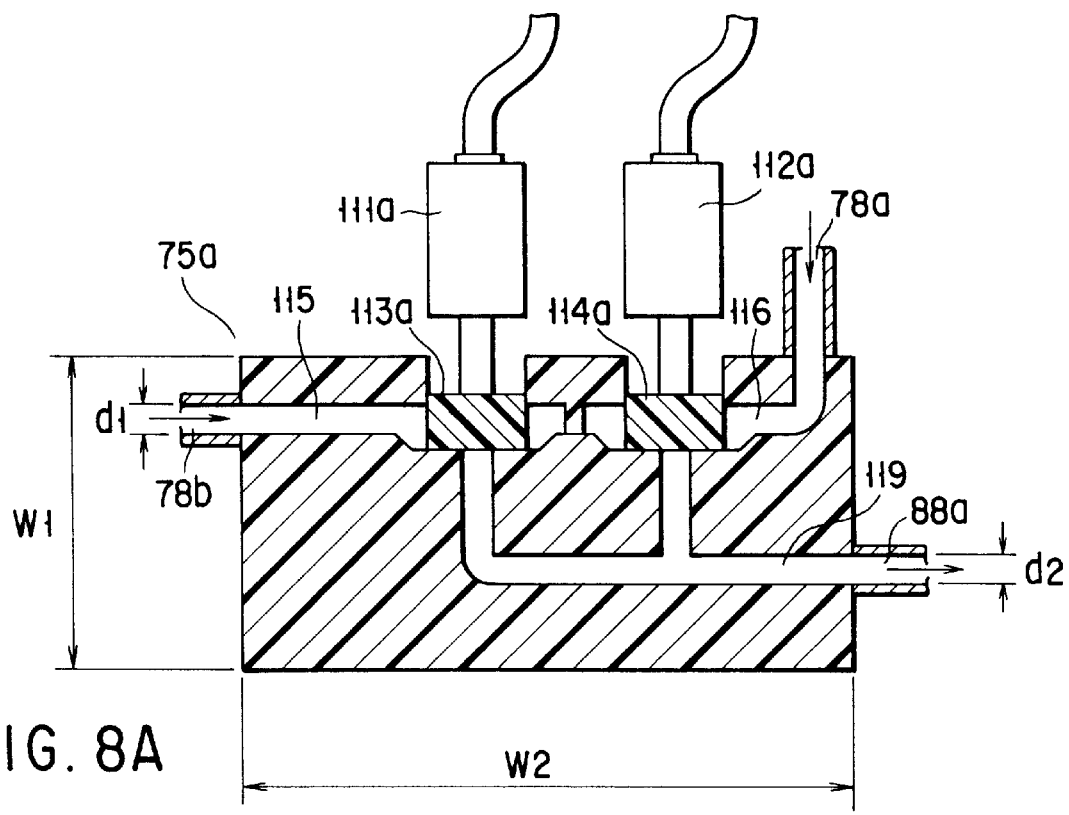
FIGS. 8A and 8B are cross sectional views each showing in detail a front stage stream-combining valve.
Figure 8B:
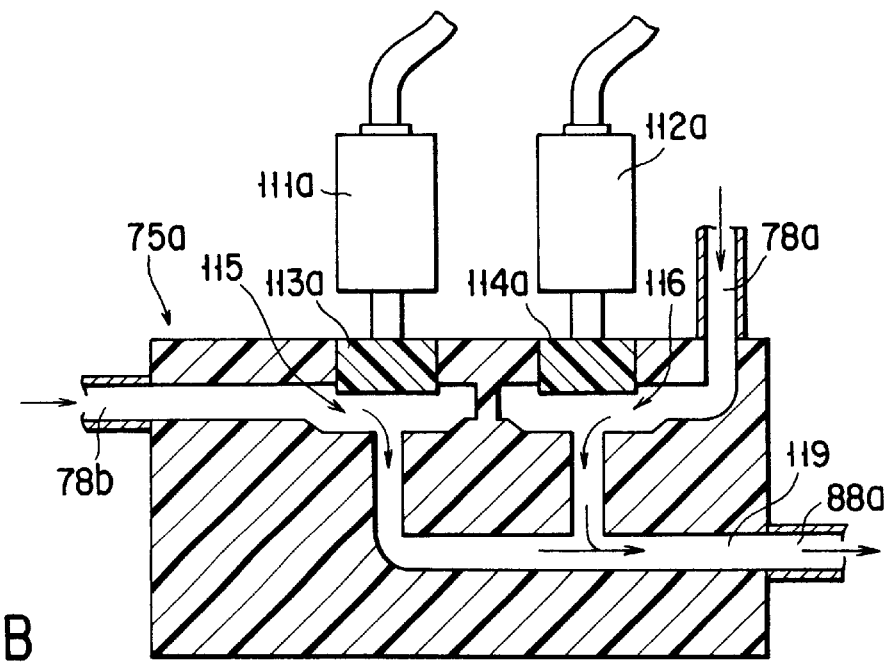

FIGS. 8A, 8B and 9A to 9C collectively show in detail the constructions of the front stage and rear stage stream-combining valves 75a and 75b. These front stage and rear stage stream-combining valves 75a and 75b are substantially equal to each other in construction. To be more specific, the front stage stream-combining valve 75a includes two inlet passageways 115, 116 and a single outlet passageway 119, as shown in FIGS. 8A and 8B. The first inlet passageway 115 communicates with the thinner supply circuit 78b, with the second inlet passageway 116 communicating with the resist solution supply circuit 78a. A first valve body 113a is movably supported by a rod of a first air cylinder 111a so as to open or close the first inlet passageway 115. On the other hand, a second valve body 114a is movably supported by a rod of a second air cylinder 112a so as to open or close the second inlet passageway 116. As seen from the drawing, the outlet port of the front stage stream-combining valve 75a communicates with a circuit 88a.

Figure 9A:
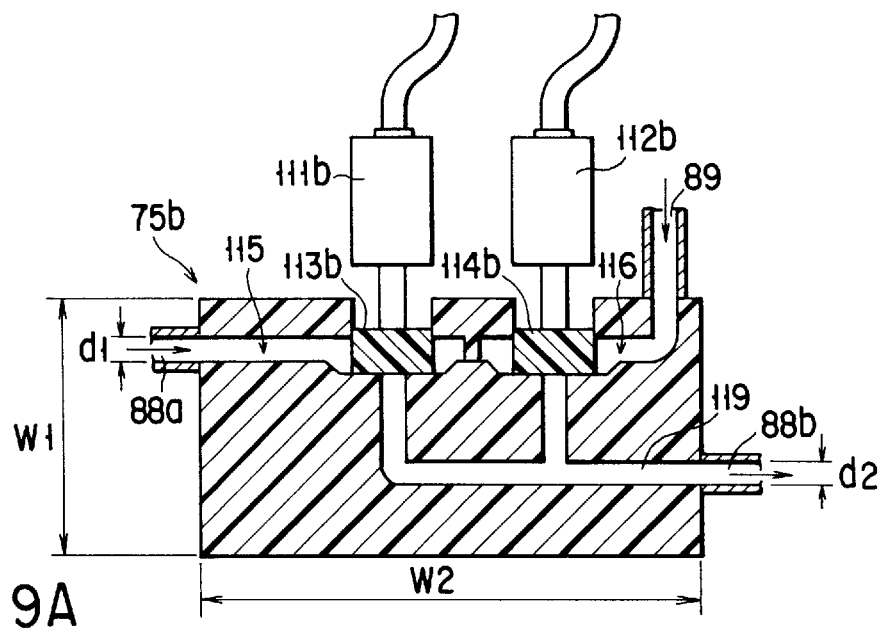
FIGS. 9A to 9C are cross sectional views each showing in detail a rear stage stream-combining valve.
Figure 9B:
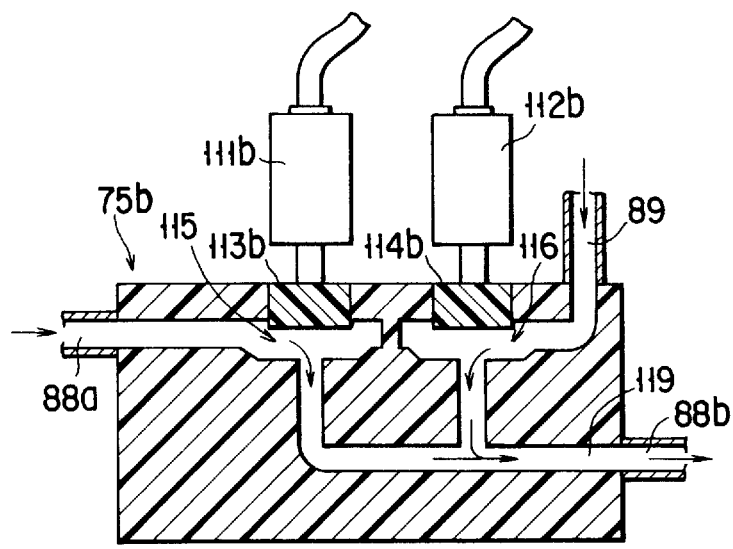
Figure 9C:
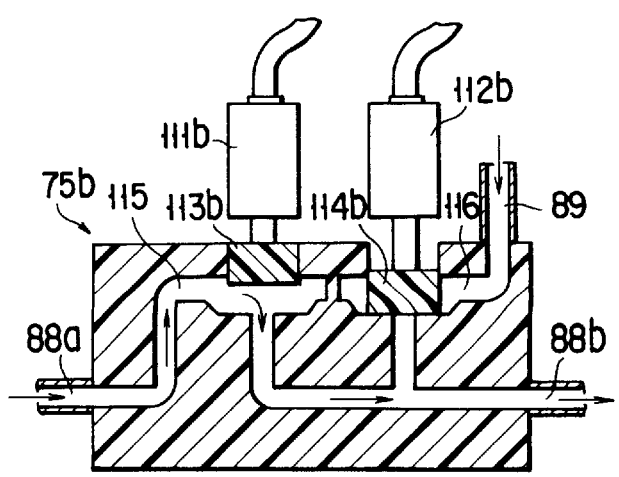

FIGS. 9A to 9C collectively show in detail the construction of the rear stage stream-combining valve 75b. As shown in the drawings, the valve 75b includes two inlet passageways 115, 116 and a single outlet passageway 119. The first inlet passageway 115 communicates with a circuit 88a, with the second inlet passageway 116 communicating with a second thinner supply circuit 89. A first valve body 113b is movably supported by a rod of a first air cylinder 111b so as to open or close the first inlet passageway 115. On the other hand, a second valve body 114b is movably supported by a rod of a second air cylinder 112b so as to open or close the second inlet passageway 116. Further, the outlet port of the rear stage stream-combining valve 75b communicates with a circuit 88b on the side of the lowermost stream. The final valve 77 and the nozzle 86 are mounted to the circuit 88b. It should be noted that the controller 131 permits the air cylinders 111, 112 to be operated in synchronism with the elongation-folding operations of the bellows pumps 73, 74a. Incidentally, the driving section for opening-closing the final valve 77 is substantially equal to those of the stream-combining valves 75a, 75b.

Each of these stream-combining valves 75a, 75b has a height W1 of about 30 mm and a length W2 of about 50 mm. Further, the width of each of these valves 75a, 75b is substantially equal to the height W1. Each of the first and second inlet passageways 115, 116 has an inner diameter d1 of 4.35 mm. Further, the outlet passageway 119 also has an inner diameter d2 of 4.35 mm. Incidentally, each part of the stream-combining valves 75a, 75b is made of a PTFE resin.

As shown in FIGS. 8A and 8B, the controller 131 permits the operation of the front stage stream-combining valve 75a to be repeated. To be more specific, the condition shown in FIG. 8A, in which the inlet passageways 115 and 116 are closed, and the condition shown in FIG. 8B, in which the inlet passageways 115 and 116 are opened, are alternately brought about repeatedly. Because of the repetition, the resist solution and the thinner are combined within the outlet passageway 119 of the stream-combining valve 75a, and the combined stream is forwarded into the first static mixer 76a so as to form a primary mixed resist solution.

As shown in FIGS. 9A to 9C, the controller 131 also permits the operation of the rear stage stream-combining valve 75b to be repeated. To be more specific, the condition shown in FIG. 9A, in which the inlet passageways 115 and 116 are closed, the condition shown in FIG. 9B, in which the inlet passageways 115 and 116 are both opened, and the condition shown in FIG. 9C, in which the inlet passageway 115 alone is opened, with the other inlet passageway 116 kept closed, are alternately brought about repeatedly. Because of the repetition, the primary mixed resist solution and the thinner are combined within the outlet passageway 119 of the stream-combining valve 75b, and the combined stream is forwarded into the second static mixer 76b so as to form a final mixed resist solution.

FIGS. 10A to 10G are timing charts showing the operating timings of the members of the resist coating-developing apparatus of the present invention. Specifically, FIG. 10A shows the operation of the bellows pump 73 for the resist solution. FIG. 10B shows the operation of the bellows pump 74a for the thinner. FIG. 10C shows the operation of the bellows pump 74b for the thinner. FIG. 10D shows the operations of the first and second valves 113a, 114a included in the front stage stream-combining valve 75a. FIG. 10E shows the operation of the first valve 113b included in the rear stage stream-combining valve 75b. FIG. 10F shows the operation of the second valve 114b included in the rear stage stream-combining valve 75b.

As shown in FIGS. 10A and 10B, the bellows pump 73 and the first bellows pump 74a are started up simultaneously at time t1 and are stopped simultaneously at time t7. As a result, a resist solution and a thinner are supplied from these pumps 73 and 74a toward the front stage stream-combining valve 75a. On the other hand, the second bellows pump 74b is started up at time t1 and is stopped at time t5, as shown in FIG. 10C. As a result, a thinner is supplied from the pump 74b toward the rear stage stream-combining valve 75b. It should be noted that the time period between the times t1 and t7 is about 5 seconds. Also, the time period between the times t1 and t5 is about 2 seconds.

As shown in FIG. 10D, the first and second valve bodies 113a, 114a included in the front stage stream-combining valve 75a are opened simultaneously at time t4 about 20 microseconds (ms) after the time t1 and are closed at time t10 about 20 microseconds (ms) after the time t7. It follows that the inlet passageways 115 and 116 included in the front stage stream-combining valve 75a are opened and closed simultaneously. It should be noted that the front stage stream-combining valve 75a is opened at time t4 slightly after the start-up time t1 of the pumps 73, 74a so as to prevent the residual liquid material in the previous cycle from flowing backward into the pumps 73 and 74a. Incidentally, the time period between the times t4 and t10 is about 5 seconds.

As shown in FIGS. 10E and 10F, the first and second valve bodies 113b, 114b included in the rear stage stream-combining valve 75b are opened at time t3 slightly, i.e., less than 20 microseconds, after time t1 and, then, closed at time t6 slightly, i.e., less than 20 microseconds, after time t5. The period of time between the times t3 and t6 is about 2 seconds. On the other hand, the first valve body 113b is closed at time t9 slightly, i.e., less than 20 microseconds, earlier than time t10. The time period between the times t3 and t10 is about 5 seconds.

Further, as shown in FIG. 10G, the final valve 77 is opened at time t2 intermediate between the times t1 and t4 and is closed at time t8 intermediate between the times t7 and t10. Since the final valve 77 is opened slightly before the opening of the valve bodies 113b, 114b of the rear stage stream-combining valve 75b, the resist solution and the thinner are allowed to flow smoothly into the circuit 88a so as to achieve a sufficient mixing of these two streams within the static mixer 76b.

It should be noted that the controller 131 permits the inlet passageway 115 of the rear stage stream-combining valve 75b to be opened or closed in synchronism with the front stage stream-combining valve 75a and also permits the inlet passageway 116 of the rear stage stream-combining valve 75b to be opened or closed in synchronism with the discharging-sucking operations performed by the second bellows pump 74b. The second bellows pump 74b is controlled so as to be turned on (discharging state) during the initial several seconds during the resist supply period such that the thinner stream passageway 116 of the rear stage stream-combining valve 75b is opened only during the initial several seconds noted above. As a result, the resist-thinner primary mixed stream is combined with a thinner stream and the combined streams are mixed within the static mixer 76b.

FIGS. 4, 11, 12A and 12B collectively show in detail the constructions of the two static mixers 76a, 76b. As shown in FIG. 11, each of the static mixers 76a and 76b includes a stainless steel pipe 176 and a large number of baffle plates 117a and 117b, e.g., 74 baffle plates 117a and 117b. Each of these baffle plates 117a and 117b is prepared by twisting a square plate rightward or leftward by 90°. Specifically, the baffle plate 117a shown in FIG. 12A is twisted leftward. On the other hand, the baffle plate 117b shown in FIG. 12B is twisted rightward. The baffle plates 117a twisted leftward and the baffle plates 117b twisted rightward are alternately arranged at a high density within the stainless steel pipe 176. These baffle plates 117a and 117b make it possible to stir the mixture of the resist solution and the thinner with a high efficiency.

It should be noted that the stainless steel pipe 176 should desirably have an inner diameter d3 falling within a range of between, for example, 2 mm and 8 mm. If the inner diameter d3 of the stainless steel pipe 176 is smaller than the lower limit of 2 mm, the stainless steel pipe 176 tends to be plugged. On the other hand, if the inner diameter d3 of the stainless steel pipe 176 is larger than the upper limit of 8 mm, the amount of the waste liquid to be discharged is increased when the viscosity and kind of the resist solution is changed, leading to a low utilization efficiency of the resist solution and the thinner.

In each of the static mixers 76a and 76b, a corrosion resistant film such as a tetrafluoro-ethylene resin coating, a "nymflon" plating film, TiC coating film, or a film formed by a Turframe process or an anodic oxidation is formed to cover the surfaces which are brought into contact with the resist-thinner mixed liquid such as the inner wall of the stainless steel pipe 176 and the surfaces of the baffle plates 117a, 117b. The components of the static mixers 76a, 76b are generally formed of stainless steel. However, it is also possible to use other materials such as aluminum, an aluminum alloy, titanium, a titanium alloy, a nickel alloy, a nickel-chromium alloy or a nickel-chromium-cobalt alloy for forming the components of the static mixers 76a and 76b. Further, in addition to the metallic materials exemplified above, it is also possible to use resins such as polytetrafluoro-ethylene resin (PTFE) or a polypropylene resin (PP) for forming the components of the static mixers 76a, 76b.

As shown in FIG. 4, the front stage static mixer 76a is inclined by an angle α relative to the horizontal plane such that the downstream side of the mixer 76a is positioned higher than the upstream side. Since the downstream side is positioned higher than the upstream side, the air is likely to be moved easily toward the downstream side of the front stage static mixer 76a and, thus, is released easily to the outside through the nozzle 86.

It is desirable for the inclination angle α of the front stage static mixer 76a to be at least 20°. If the angle α is 20° or more, the air does not stay within the static mixer 76a. Incidentally, since a large number of the baffle plates 117a, 117b obstruct the movement of the air toward the downstream side within the front stage static mixer 76a, the air bubbles tend to stay within the static mixer 76a. If the air bubbles stay within the static mixer 76a, the stirring efficiency of the resist solution-thinner mixture is lowered within the static mixer 76a. Incidentally, the length L1 of the front stage static mixer 76a is determined by the inner diameter d3 of the stainless steel pipe 176 and the supply amount of the resist solution for a single coating operation. To be more specific, the length L1 is determined to permit the inner volume of the static mixer 76a to be large enough to house the resist-thinner mixed liquid used in at least a single coating operation. For example, the length L1 is determined to permit the static mixer to have an inner volume of about 5 cc.

As shown in FIG. 4, the rear stage static mixer 76b is arranged immediately downstream of the final valve 77. It is not absolutely necessary for the rear stage static mixer 76b to be inclined. In the embodiment shown in the drawing, the rear stage static mixer 76b is disposed substantially horizontal. As apparent from the drawing, the length L2 of the rear stage static mixer 76b is smaller than the length L1 of the front stage static mixer 76a. For example, it is desirable for the length L2 to be about 1/10 to 1/2 of the length L1 of the front stage static mixer 76a. The length L2 of the rear stage static mixer need not be unduly large because only a small amount, e.g., 1 cc, of a resist solution of a low concentration is supplied first toward the wafer W.

The final valve 77 is arranged immediately downstream of the nozzle 86, as shown in FIG. 4. Like the stream-combining valves 75a, 75b, the final valve 77 is constructed to open or close the passageway of the resist-thinner mixed liquid by the movement of a valve body caused by an air cylinder.

Figure 13:
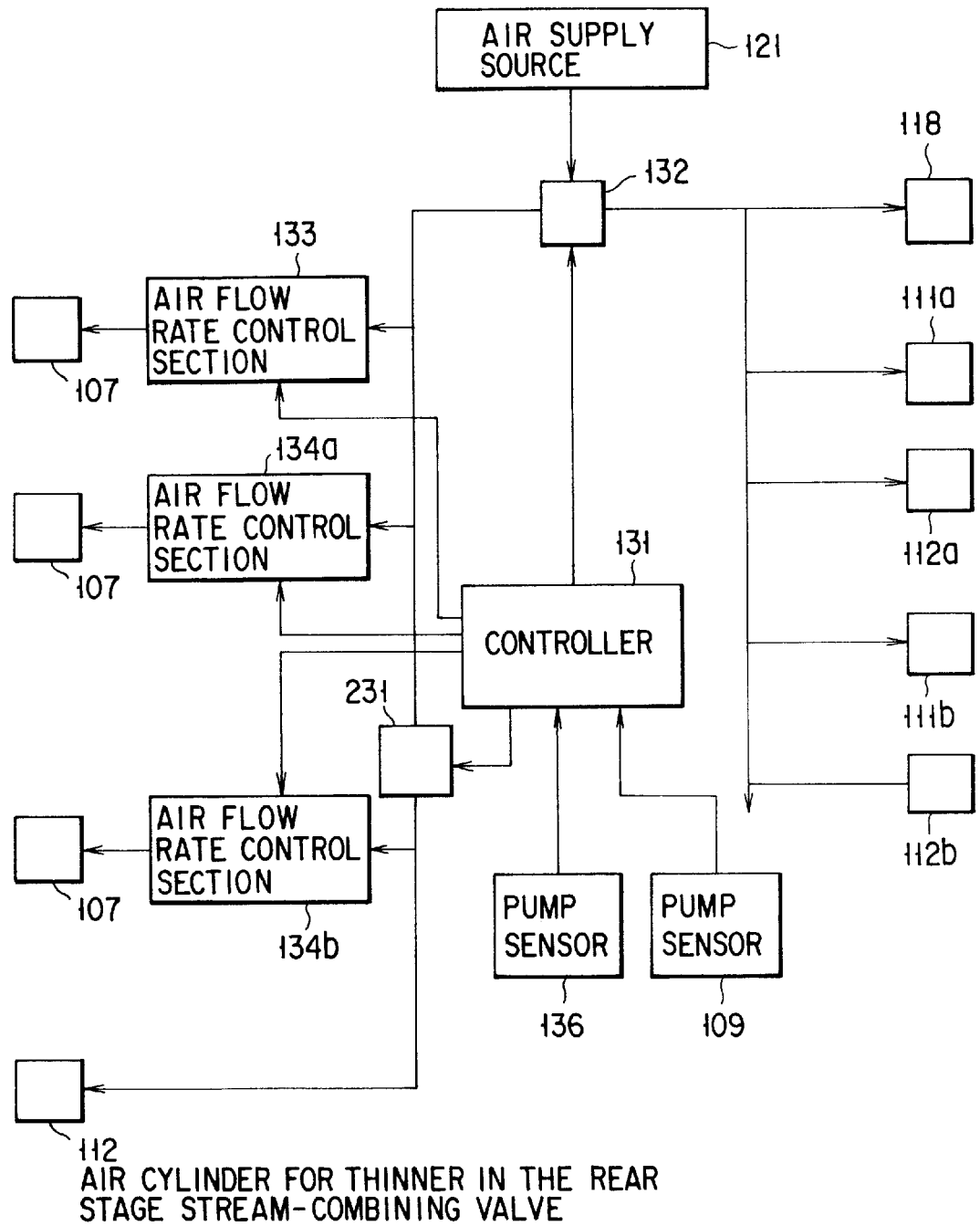
FIG. 13 is a block diagram showing the control system of a resist-thinner mixing apparatus.

FIG. 13 shows the operation of the controller 131. Specifically, the controller 131 is constructed to control a main air valve 132, and three air flow control sections 133, 134a and 134b on the basis of the detection signals supplied from the light receiving sections 109 and 136 tow sensors. The main air valve 132 consists of an electromagnetic valve communicating with an air supply source 121. The first air flow rate control section 133 serves to control the cylinder 107 of the bellows pump 73 for the resist solution. Further, the second air flow rate control section 134a serves to control the cylinder 107. Further, the third air flow rate control section 134b serves to control the cylinder 107 of the bellows pump 74b for the second thinner stream.

The main air valve 132 communicates with each of five air cylinders 118, 111a, 111b, 112a and 112b. Incidentally, the air cylinder 118 serves to open or close a valve body (not shown) of the final valve 77.

The controller 131 supplies a control signal to each of the three air flow rate control sections 133, 134a and 134b in accordance with the initially set data supplied by an operator to the controller 131. As a result, it is possible to control the liquid discharge amount per unit time from each of the bellows pumps 73, 74a, and 74b. Since the liquid discharge amount per unit time from each of the bellows pumps 73, 74a, and 74b is controlled in this fashion, it is possible to set as desired the mixing ratio of the resist solution to the thinner (or to control the resist concentration of the mixed liquid), with the result that the viscosity of the resist solution can be controlled at a desired target value.

It should also be noted that the output signals of the light sensors 109, 136 serving to detect the end point of the discharge step of each of the bellows pumps 73, 74a, 74b are supplied to the controller 131. Based on the detection signal supplied first from one of these light sensors 109, 136, the controller 131 permits the main air valve 132 to the closed, and also permits the air cylinders 107, 111a, 112a, 111b, 112b and 118 of the final valve 77, and the bellows pumps 73, 74a, 74b to be turned off.

It should be noted that a subtle gap in the timing is provided in the on-off operations of the stream-combining valves 75a, 75b, the final valve 77, and the bellows pumps 73, 74a, 74b. The particular gap in the timing can be controlled as desired by changing the lengths of the air supply pipes connected between the main air valve 132 and the individual air cylinders 107, 111a, 112a, 111b, 112b, 118. As described previously, if the time t4 is earlier than the time t1, the residual liquid for the previous cycle tends to flow backward into the front stage stream-combining valve 75a. To prevent the difficulty, the front stage stream-combining valve 75a is opened 20 microseconds after the start-up time t1 in the compression step (or folding step) of each of the bellows pumps 73, 74a, 74b. Also, when each of these bellows pumps 73, 74a and 74b is in the elongation step, the final valve 77 is closed earlier than the front stage stream-combining valve 75a. In other words, the time t8 is set earlier than the time t10 so as to prevent the resist solution from being dripped from the nozzle 86 onto the wafer W.

The resist coating apparatus of the present invention constructed as described above is operated as follows. In the first step, the operator supplies in advance to the controller 131 the data for setting the viscosity of a resist solution which is to be supplied to the wafer W. The viscosity thus set conforms with a corresponding table between the viscosity of the resist solution at the process temperature and the stroke velocity (i.e., the discharge amount per unit time) of each of the bellows pumps 73, 74*a* and 74*b*. The supply amount of the resist-thinner mixed liquid for each cycle is determined by using a position detecting information given from the sensors 108, 109, 137 and 136. For example, 0.5 cc of a thinner is added to and mixed with the first 1 cc of the resist solution spurted from the nozzle 86. In this fashion, it is possible to decrease the amount of the resist solution used for a single cycle.

Upon receipt of the set data on the viscosity of the resist solution supplied from the operator, the controller 131 reads out from the corresponding table the data on the stroke velocity of each of the corresponding bellows 73, 74*a* and 74*b* so as to supply control signals corresponding to the desired stroke velocity to the three air flow rate control mechanisms 133, 134*a* and 134*b* serving to control the driving of the bellows pumps 73, 74*a* and 74*b*, respectively. As a result, the stroke velocity, i.e., the discharge amount per unit time, is set for each of the bellows pumps 73, 74*a* and 74*b*.

After completion of the setting described above, the controller 131 opens the main air valve 132. If the main air valve 132 is opened, air is supplied to each of the air cylinders 107, 111*a*, 112*a*, 111*b*, 112*b*, and 118 of the bellows pumps 73, 74*a* and 74*b*. As a result, each of these bellows pumps 73, 74*a* and 74*b* is folded to compress the air housed therein. At the same time, each of the stream combining valves 75*a*, 75*b* and the final valve 77 is opened. When these valves are opened, the resist solution and the thinner sucked into the bellows pumps 73, 74*a* from the resist tank 71 and the thinner tank 72 are combined within the front stage stream-combining valve 75*a* and, then, the combined stream is stirred and mixed within the first static mixer 76*a* so as to prepare the primary mixed liquid material. Further, the primary mixed liquid material is combined with a second thinner within the rear stage stream-combining valve 75*b* and, then, the combined stream is stirred and mixed within the second static mixer 76*b* so as to prepare a final mixed liquid material.

When any of the bellows pumps 73, 74*a*, 74*b* reaches the end point of the discharge step, the position detecting signals generated from the sensors 108, 109, 137, 136 are supplied to the controller 131 so as to close the main air valve 132. The discharge (compression) operation of each of the bellows pumps 73, 74*a*, 74*b* is finished by closing the main air valve 132. Then, the folding pipe 102 is elastically elongated so as to suck the resist solution and the thinner. Also, each of the stream combining-valves 75*a*, 75*b* and the final valve 77 is closed substantially simultaneously with the change into the sucking step of the folding pipe 102 so as to finish supply of the resist solution onto the wafer W.

In the coating apparatus of the embodiment described above, a resist solution of a desired viscosity is prepared by mixing a resist solution and a thinner, and the resultant mixed liquid material is supplied onto the wafer surface. It follows that a resist solution of a desired viscosity can be supplied onto the wafer surface by using a single resist solution tank and a single thinner tank. It follows that it is possible to meet easily and promptly the requirement for a change in a thickness of the resist film which is to be formed on a wafer surface. Of course, it is also possible to cope easily with a change in a thickness of the resist film caused by the daily differences in the environmental conditions.

The solid components contained in the resist solution affect the thickness itself and uniformity in the thickness of the resist film. Specifically, FIG. 15 is a graph showing the relationship between the solid content of the resist solution and the thickness of the resist film formed on a wafer. In this experiment, the liquid material spurted from the nozzle is partly replaced by a solid material (cc). In the graph of FIG. 15, the amount of the solid material replacement is plotted on the abscissa, with the resist film thickness (nm) being plotted on the ordinate. Naturally, the resist film is not formed in the case where the amount of the solid material replacement is zero, as apparent from FIG. 15. The target ratio of the solid component to the entire liquid was set at 23%. As apparent from the graph, the thickness of the resist film was stabilized at 1601.6 nm where the amount of the solid material replacement was 80 cc or more. The flow rates of the first resist solution and the first and second solvents were controlled to permit the final mixed liquid material to have a viscosity of about 17 cp.

FIG. 16 is a graph showing the relationship between the solid content of the resist solution and the nonuniformity in the thickness of the resist film formed on a wafer. The amount of replacement of the solid component (cc) is plotted on the abscissa of the graph, with the nonuniformity (nm) of the resist film being plotted on the ordinate. The experiment was conducted under the conditions equal to those for the experiment relating to FIG. 15. As apparent from the graph, the nonuniformity in the thickness of the resist film is less than 4 nm where the amount of replacement of the solid component is 80 cc or more, supporting that a resist film of a uniform thickness can be formed on a wafer.

Where the viscosity of the resist solution is changed in accordance with the requirement for a change in the thickness of the resist film to be formed on the wafer surface, all the resist solution used before the change in the viscosity of the resist solution and remaining within the piping of the resist supply circuit is discharged to the outside in the embodiment described above. The residual resist solution is discharged to the outside, for example, as follows. Specifically, the resist nozzle 86 is moved first to a waiting position. Then, a resist solution and a thinner are continuously supplied to the system under the discharge conditions of the bellows pumps 73, 74*a*, 74*b* set after the change in the viscosity of the resist solution. These resist solution and thinner are continuously supplied in amounts larger than the capacity of the piping system downstream of the bellows pumps 73, 74*a*, 74*b* so as to push out all the residual liquid material remaining within the piping system arranged downstream of the bellows 73, 74*a*, 74*b* through the resist nozzle 86. As a result, the residual resist solution having a viscosity different from the desired viscosity is prevented from being supplied onto the wafer surface, making it possible to supply a resist solution having a desired viscosity even onto the wafer W which is processed first after the change in the target value of the thickness of the resist film. It follows that it is possible to form a resist film of a desired thickness on the surface of every wafer W.

As described above, the embodiment described above is featured in that, in forming a resist coating film on the surface of a wafer W, a resist-thinner mixed liquid material containing a relatively large amount of the thinner is supplied first to the wafer W, followed by supplying a resist-thinner mixed liquid material having a high resist concentration to the wafer W. What should be noted is that the entire surface of the wafer W is sufficiently wetted first with the resist-thinner mixed liquid material containing a large amount of the thinner. Then, the resist-thinner mixed liquid material having a high resist concentration, which is supplied in the subsequent step, is allowed to spread uniformly over the entire region of the wet substrate surface, making it possible to form a uniform resist film of a desired thickness over the entire surface region of the substrate.

What should also be noted is that, in this embodiment, the wet state of the wafer surface can be controlled in accordance with, for example, the size of the wafer W by controlling the amount of the thinner added to the resist-thinner mixed liquid material, making it possible to carry out the resist coating operation under a broader range of the conditions. Further, a thinner is further added to a primary resist-thinner mixed liquid material immediately before discharge of the mixed liquid material from the nozzle 86. It follows that the mixed liquid material having a low resist concentration can be supplied onto the wafer surface before the resist solution and the thinner are separated from each other. Naturally, the resist solution is allowed to rapidly spread over the entire surface region of the wafer, making it possible to form a thin resist film uniformly.

Figure 14:
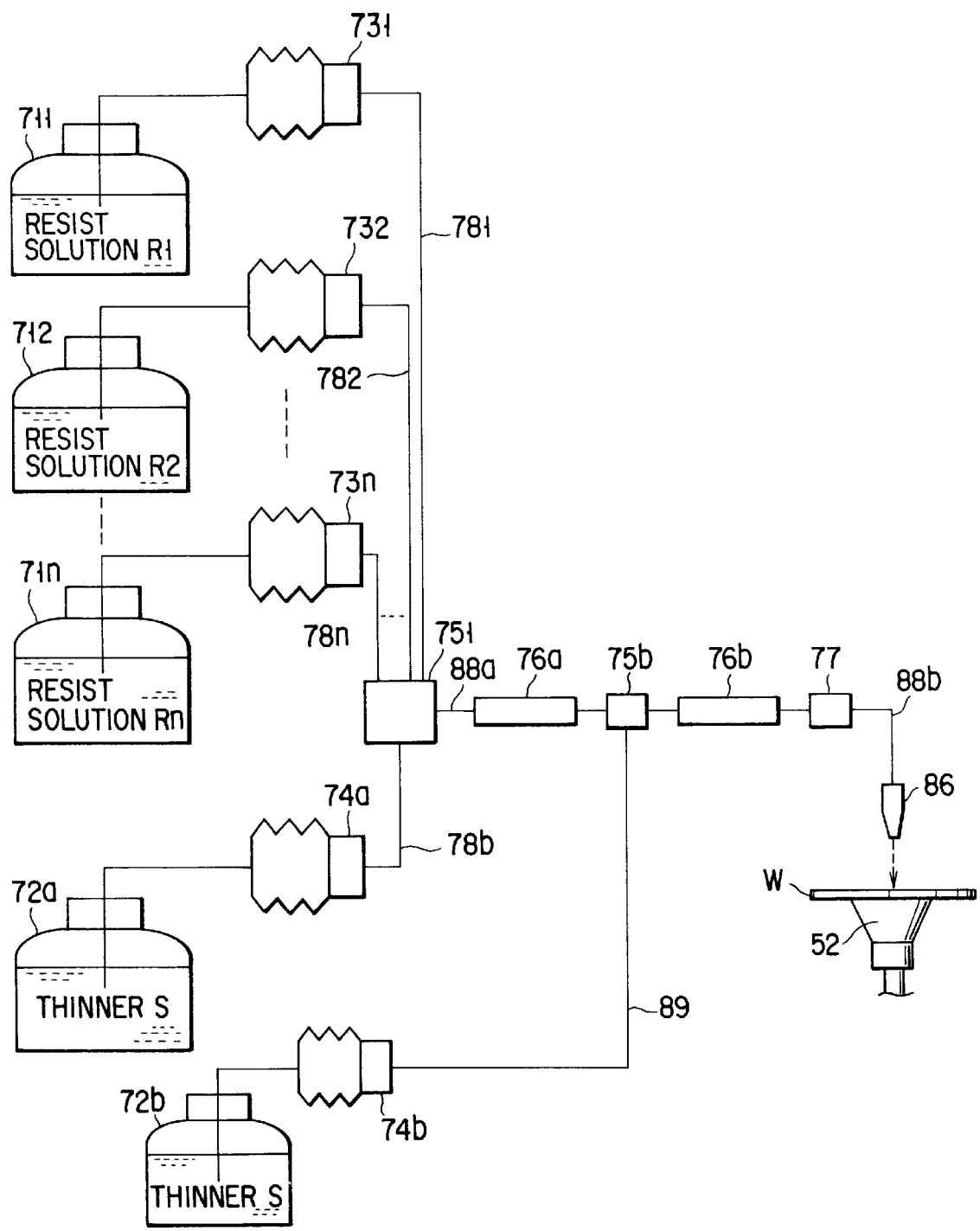
FIG. 14 is a block diagram showing the control system of a resist-thinner mixing apparatus according to another embodiment of the present invention.

FIG. 14 shows a coating apparatus according to a second embodiment of the present invention. Those portions of the second embodiment which are common with the first embodiment are omitted in the following description.

The coating apparatus of the second embodiment comprises n-number of resist tanks 71₁ to 71n housing resist solutions differing from each other in composition. First resist solution R1 to n-th resist solution Rn differing from each other in composition are housed in these resist tanks 71₁ to 72n, respectively. These first to n-th resist solutions R to Rn include, for example, a phenolic novolak resin resist, a chemical amplification type resist, etc. whose concentration and viscosity are adjusted appropriately. Also, bellows pumps 73₁ to 73n are mounted to the resist supply circuits connected to the resist tanks 71₁ to 71n, respectively. The coating apparatus further comprises two thinner tanks 72a and 72b. To be more specific, a thinner supply circuit 78b for the thinner tank 72a is combined within a first stream-combining valve 751 with each of the resist supply circuits 78₁ to 78n. Incidentally, the apparatus of the second embodiment is equal to that of the first embodiment in the circuit construction downstream of the first stream-combining valve 751.

In each of the embodiments described above, a semiconductor wafer is coated with a resist solution. However, the technical idea of the present invention can also be employed in coating, for example, an LCD substrate with a resist solution. Also, a photoresist solution alone is used as a coating material in each of the embodiments described above. However, the technical idea of the present invention can also be employed for forming, for example, a protective film by using a polyimide resin solution as a coating material. Further, the technical idea of the present invention is employed in a coating apparatus equipped with a spin chuck (spin coater) in each of the embodiments described above. However, the technical idea of the present invention can also be employed in a slit coater disclosed in, for example, U.S. patent application Ser. No. 08/914,819 filed on Aug. 20, 1997.

As described above in detail, the present invention is featured in that a resist solution having a low concentration (final mixed liquid material) is supplied first onto a substrate surface, followed by supplying a resist solution having a high concentration (primary mixed liquid material) onto the substrate surface, with the result that the resist solution having a high concentration (primary mixed liquid material) is allowed to spread rapidly over the entire surface region of the substrate. It follows that it is possible to form a thin resist film uniformly on the substrate surface.

What should also be noted is that a resist solution having a low concentration (final mixed liquid material) is prepared immediately before supply of the mixed liquid material onto the substrate surface. As a result, even if the mixed liquid material consists of incompatible materials such as a resist solution and a thinner, these incompatible materials are sufficiently kept mixed physically when supplied onto the substrate surface. Further, the amount of the solvent relative to the primary mixed liquid material having a high resist concentration can be controlled appropriately depending on, for example, the size of the substrate, making it possible to form a satisfactory coating film under a wide range of conditions.

We claim:

1. A coating apparatus, comprising:

a substrate holding member for holding a substrate to be processed;

a process solution supply source housing an initial process solution containing a solvent;

first and second solvent supply sources each housing a solvent;

a first stream-combining valve communicating with each of said first solvent supply source and said process solution supply source;

a first pump for supplying said initial process solution from the process solution supply source toward said first stream-combining valve;

a second pump for supplying a solvent from said first solvent supply source toward said first stream-combining valve;

a first mixer for mixing under stirring the initial process solution flowing out of said first stream-combining valve with a solvent;

a second stream-combining valve arranged downstream of said first mixer and communicating with each of the first mixer and said second solvent supply source;

a third pump for supplying the solvent from said second solvent supply source toward the second stream-combining valve;

a second mixer for mixing under stirring said primary mixed liquid material coming out of said second stream-combining valve with a solvent so as to prepare a final mixed liquid material;

a nozzle equipped with a liquid spurting port for spurting said final mixed liquid material prepared in said second mixer toward the substrate held by said substrate holding member; and a controller for controlling each of the first, second, third pumps and the first and second stream-combining valves so as to control the mixing ratio of the initial process solution to the solvent and to control the mixing ratio of the primary mixed liquid material to the solvent.

2. The coating apparatus according to claim 1, wherein said substrate holding member holds a substrate by vacuum suction and rotates the substrate about an axis perpendicular to the substrate surface to be processed.

3. The coating apparatus according to claim 1, further comprising a final valve mounted intermediate between said second mixer and said nozzle for allowing the final mixed liquid material prepared in the second mixer to be supplied or not to be supplied into the nozzle.

4. The coating apparatus according to claim 1, wherein:

said process solution supply source includes a plurality of process solution tanks housing initial process solutions differing from each other in composition, each tank housing a single kind of the initial process solution; and said first stream-combining valve includes switching means for changing-over the kind of the initial process solution supplied to said first mixer by selecting one process solution tank from among said plural process solution tanks, a solvent passageway communicating with said first solvent supply source, a valve seat formed in said solvent passageway, a first valve body for opening or closing the solvent passageway, and a first cylinder for pressing said first valve body against said valve seat or moving said first valve body away from the valve seat.

5. The coating apparatus according to claim 4, wherein said switching means includes a plurality of process solution passageways communicating with said plural process solution tanks, a valve seat formed in each of said process solution passageways, a second valve body for opening or closing the process solution passageway, and a second cylinder for allowing said second valve body to be pressed against the valve seat or to be moved away from the valve seat.

6. The coating apparatus according to claim 5, wherein each of said first, second and third pumps includes a folding pipe communicating with a liquid reservoir and a third cylinder for folding and elongating said folding pipe.

7. The coating apparatus according to claim 6, further comprising a sensor for detecting the amount of displacement of said folding pipe, the detection signal being supplied from said sensor to said controller to allow the controller to control the operation of the cylinders for the first, second and third pumps.

8. The coating apparatus according to claim 6, wherein said controller permits the cylinders for the first, second and third pumps to be started up simultaneously at time t1, permits the cylinder for the third pump to be stopped at time t5, permits the cylinders for the first and second pumps to be stopped simultaneously at time t7, permits one of the solvent passageway and the process solution passageway within the first stream-combining valve to be opened at time t4 after said time t1, and also permits the solvent passageway and the process solution passageway within the first stream-combining valve to be opened simultaneously at time t10 after said time t7.

9. The coating apparatus according to claim 5, further comprising a main air valve for controlling the air flow rate and air pressure supplied to each of the first, second and third cylinders, said main air valve being controlled by said controller.

10. The coating apparatus according to claim 1, wherein said controller controls said first, second, third pumps and said first and second stream-combining valves to permit said final mixed liquid material to be supplied first onto a surface of the substrate and, then, permit the primary mixed liquid material to be supplied onto said surface of the substrate.

11. The coating apparatus according to claim 1, wherein a target value and an allowable range of said target value of at least one of a viscosity, a solid component content and a concentration of a final mixed liquid material spurted from said nozzle are set, and said controller individually controls the supply amount per unit time of the initial process solution from said process solution supply source and the supply amount per unit time of the solvent from each of the first and second solvent supply sources so as to permit at least one of the viscosity, the solid component content and the concentration of the final mixed liquid material spurted from the nozzle to fall within said allowable range of said target value.

12. The coating apparatus according to claim 1, wherein each of said first and second mixers is a static mixer having a plurality of baffle plates arranged in series within the fluid passageway of the mixer.

13. The coating apparatus according to claim 12, wherein said baffle plate is prepared by twisting one side of a square plate leftward or rightward by 90°, and the baffle plates twisted leftward and twisted rightward are alternately arranged within the fluid passageway of the mixer.

14. The coating apparatus according to claim 12, wherein said second mixer is positioned immediately upstream of the nozzle.

15. The coating apparatus according to claim 12, wherein an edge portion on the downstream side of the first mixer is positioned higher than an edge portion on the upstream side of the first mixer.

16. The coating apparatus according to claim 15, wherein the fluid passageway of the first mixer is inclined by at least 20° relative to a horizontal plane.

17. The coating apparatus according to claim 1, wherein said second stream-combining valve includes a plurality of inlet passageways and a single outlet passageway.

18. The coating apparatus according to claim 17, wherein one of said plural inlet passageways communicates with said second solvent supply source.

* * * * *